(12) United States Patent
Komuro et al.

(10) Patent No.: US 12,255,141 B2
(45) Date of Patent: *Mar. 18, 2025

(54) SEMICONDUCTOR INTEGRATED CIRCUIT DEVICE

(71) Applicant: SOCIONEXT INC., Kanagawa (JP)

(72) Inventors: Hideyuki Komuro, Yokohama (JP); Junji Iwahori, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/410,874

(22) Filed: Jan. 11, 2024

(65) Prior Publication Data
US 2024/0145390 A1    May 2, 2024

Related U.S. Application Data

(63) Continuation of application No. 17/322,570, filed on May 17, 2021, now Pat. No. 11,908,799, which is a
(Continued)

(30) Foreign Application Priority Data

Nov. 26, 2018   (JP) ................. 2018-220392

(51) Int. Cl.
*H01L 23/528*    (2006.01)
*H01L 23/535*    (2006.01)
*H01L 27/092*    (2006.01)

(52) U.S. Cl.
CPC ........ *H01L 23/5286* (2013.01); *H01L 23/535* (2013.01); *H01L 27/092* (2013.01)

(58) Field of Classification Search
CPC . H01L 23/5286; H01L 23/535; H01L 27/092; H01L 21/823871; H01L 29/41766;
(Continued)

(56) References Cited

U.S. PATENT DOCUMENTS

2012/0138886 A1   6/2012   Kuhn et al.
2016/0211276 A1   7/2016   Liu et al.
(Continued)

FOREIGN PATENT DOCUMENTS

JP    2003-224195 A    8/2003
JP    2005-032839 A    2/2005
(Continued)

OTHER PUBLICATIONS

Ryckaert, J, et al. "The Complementary FET (CFET) for CMOS scaling beyond N3," 2018 IEEE; 2018 Symposium on VLSI Technology Digest of Technical Papers; pp. 141-142.
(Continued)

*Primary Examiner* — Allison Bernstein
(74) *Attorney, Agent, or Firm* — Rimon P.C.

(57) ABSTRACT

A layout structure of a capacitance cell using a complementary FET (CFET) is provided. A capacitance part includes a first three-dimensional transistor of a first conductivity type and a second three-dimensional transistor of a second conductivity type formed above the first transistor in the depth direction. The source and drain of the first transistor are both connected to VDD or VSS, and the source and drain of the second transistor are both connected to VDD or VSS. The gates of the first and second transistors are both connected to the gate of a transistor included in a fixed-value output part, and are supplied with VDD or VSS.

14 Claims, 21 Drawing Sheets

Related U.S. Application Data continuation of application No. PCT/JP2019/044574, filed on Nov. 13, 2019.

(58) Field of Classification Search
CPC .............. H01L 29/785; H01L 21/8221; H01L 27/0207; H01L 27/0688; H01L 29/0673; H01L 29/42392; H01L 29/775; H01L 29/78696; H01L 29/94; H01L 27/0629; B82Y 10/00
See application file for complete search history.

(56) References Cited

U.S. PATENT DOCUMENTS

| 2019/0198530 | A1 | 6/2019 | Hino et al. | |
|---|---|---|---|---|
| 2021/0028191 | A1 | 1/2021 | Hino et al. | |
| 2021/0366902 | A1* | 11/2021 | Sobue | H01L 27/0629 |

FOREIGN PATENT DOCUMENTS

| JP | 2012-103774 A | 5/2012 |
|---|---|---|
| JP | 2014-505995 A | 3/2014 |
| WO | 2018/042986 A1 | 3/2018 |

OTHER PUBLICATIONS

Mocuta, A. et al., "Enabling CMOS Scaling Towards 3nm and Beyond," 2018 IEEE; 2018 Symposium on VLSI TEchnology Digest of Technical Papers; pp. 147-148.

International Search Report and Written Opinion issued in International Patent Application No. PCT/JP2019/044574, dated Dec. 24, 2019; with partial English translation.

Notice of Allowance issued in corresponding U.S. Appl. No. 17/322,570, dated Oct. 18, 2023.

* cited by examiner

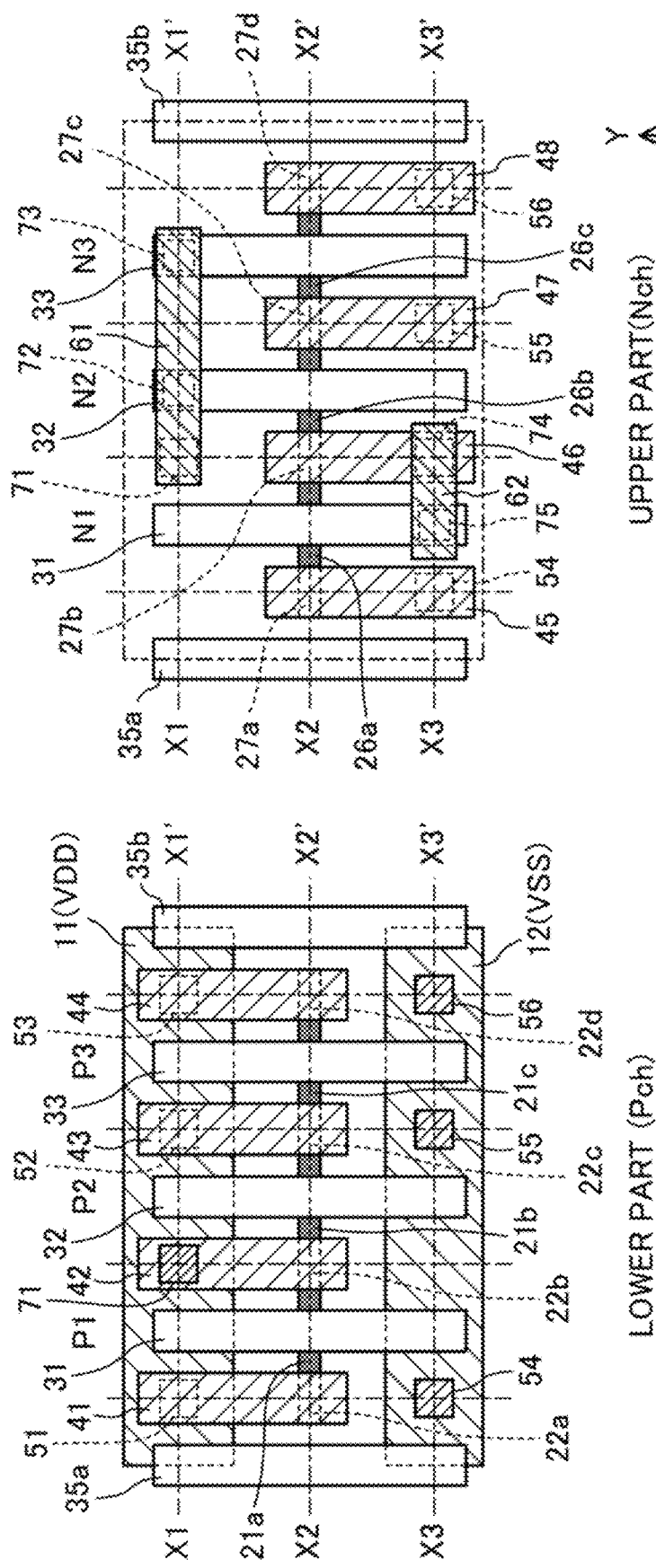

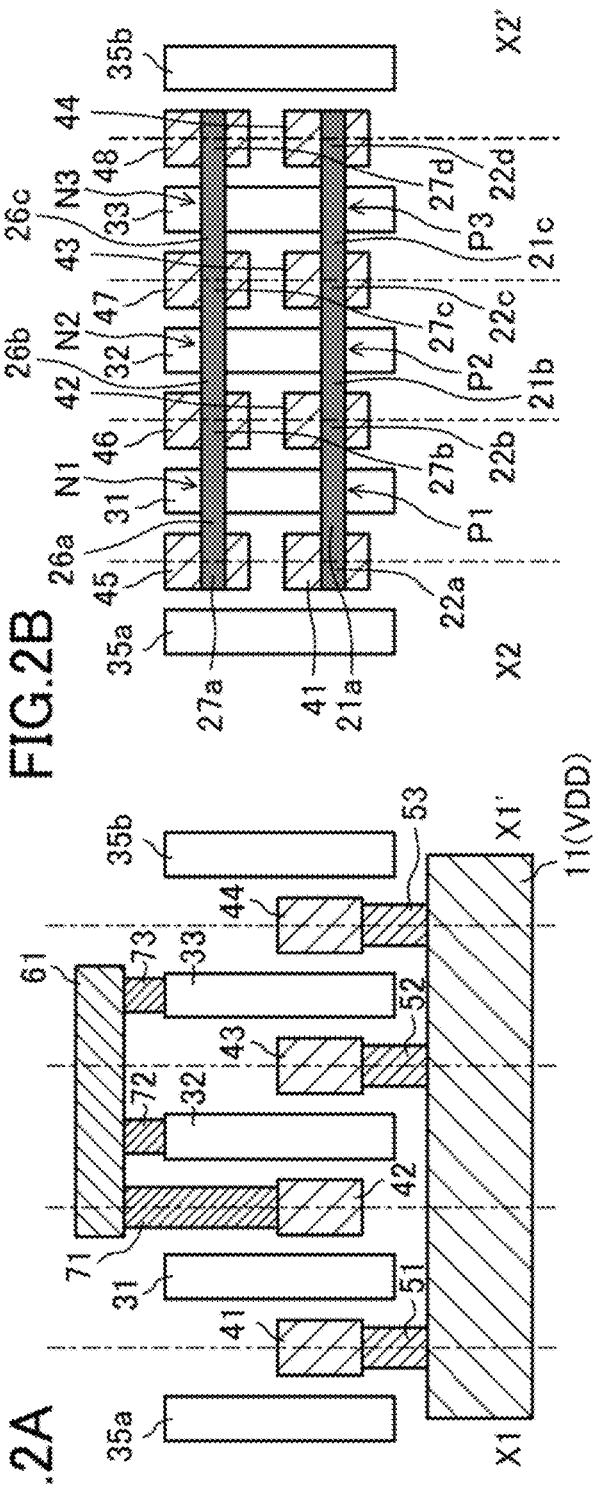
FIG.2A
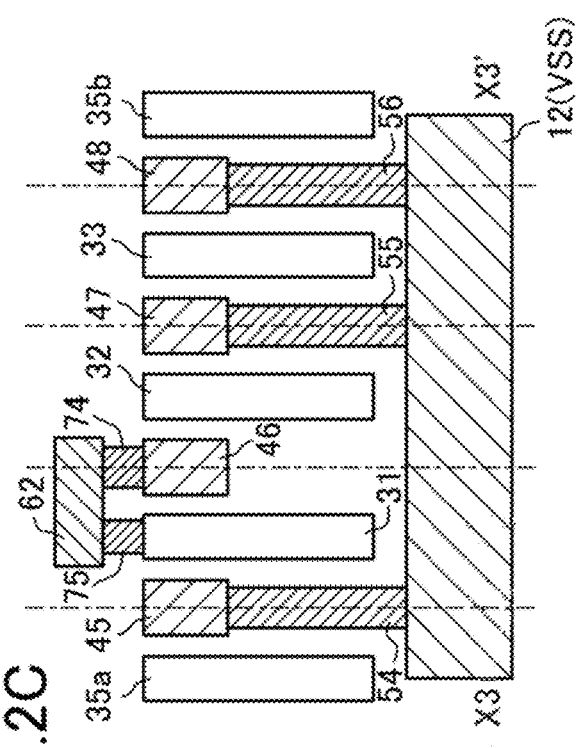
FIG.2B
FIG.2C

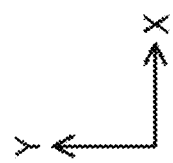
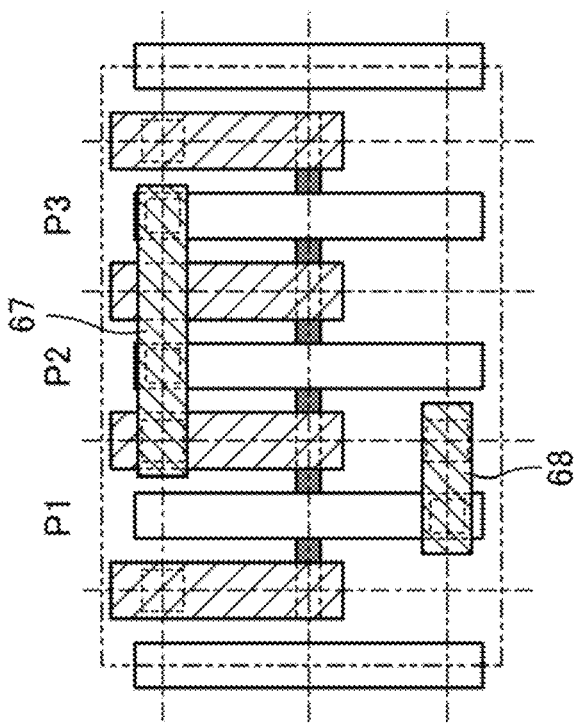
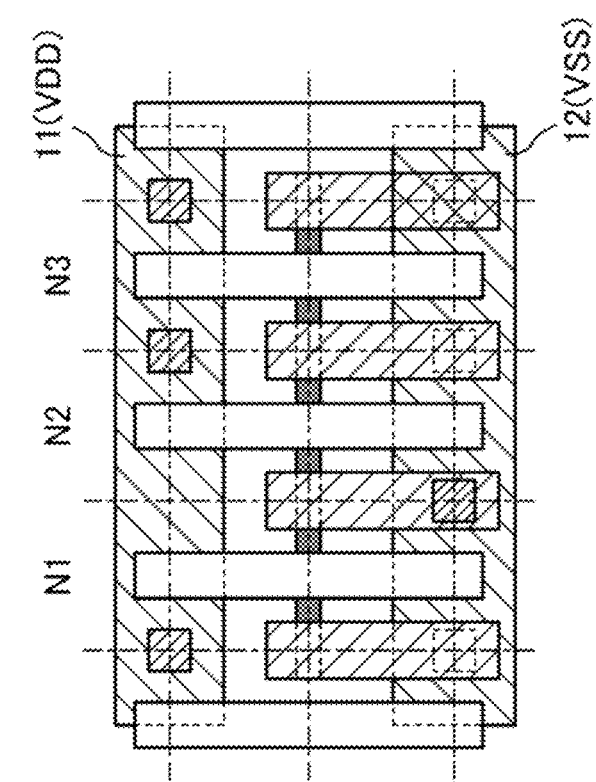
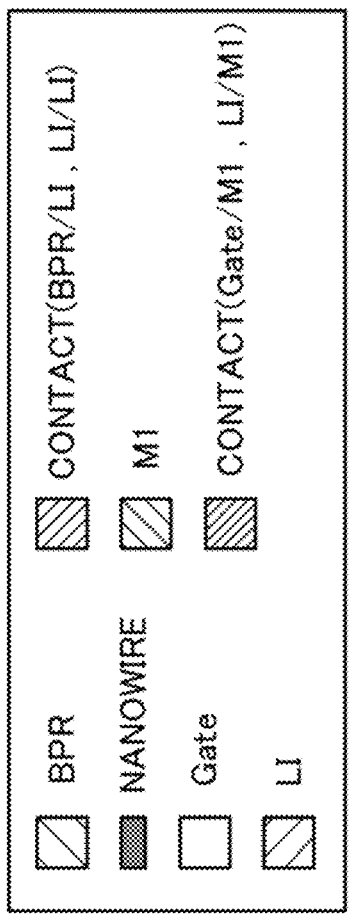

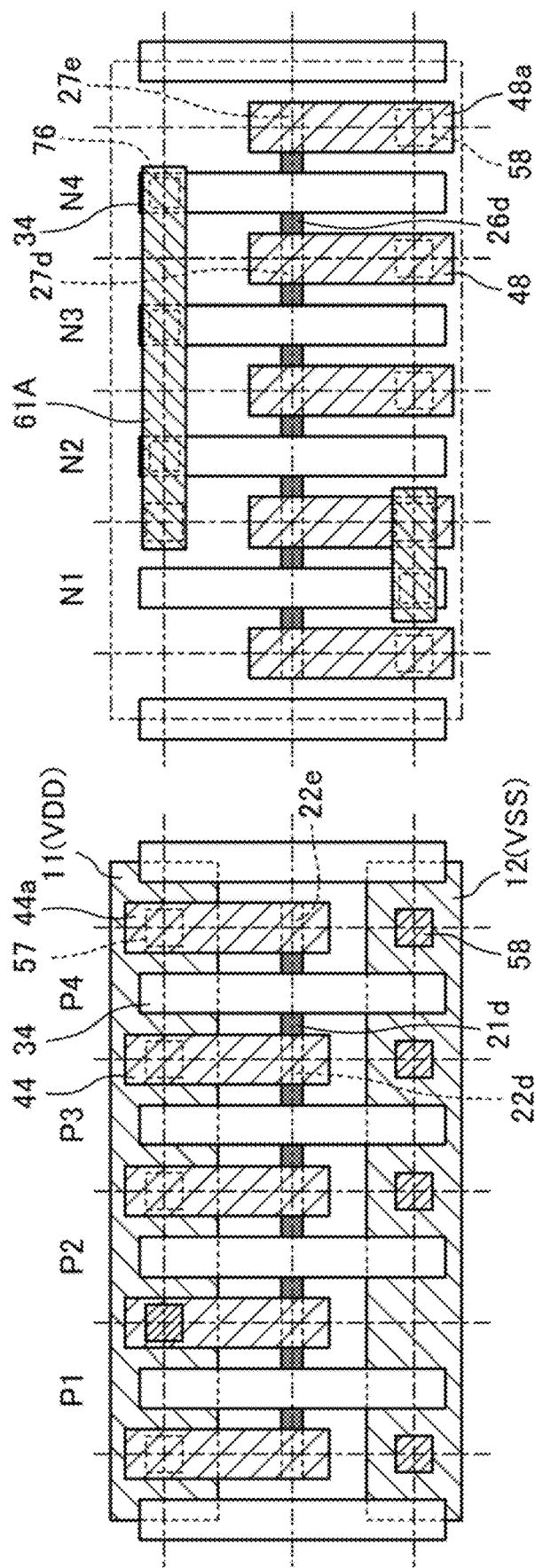

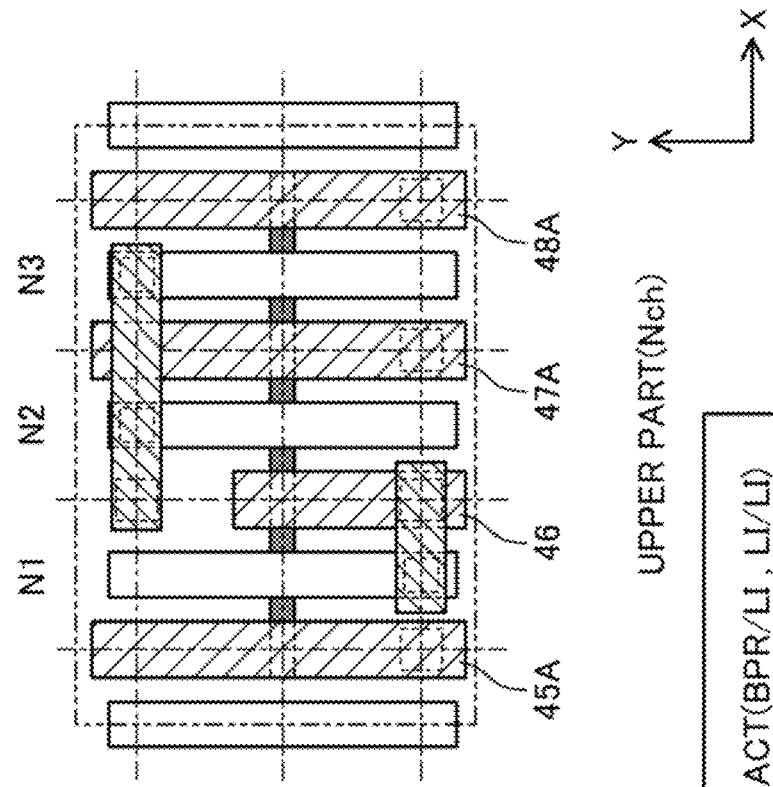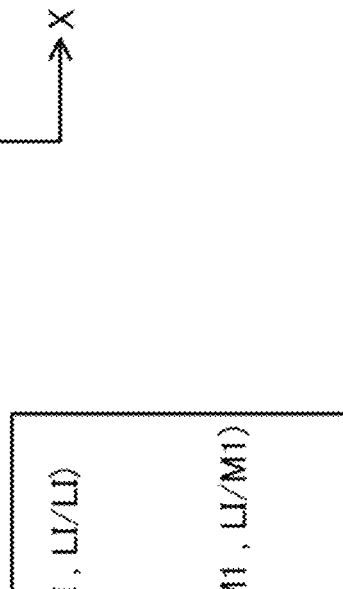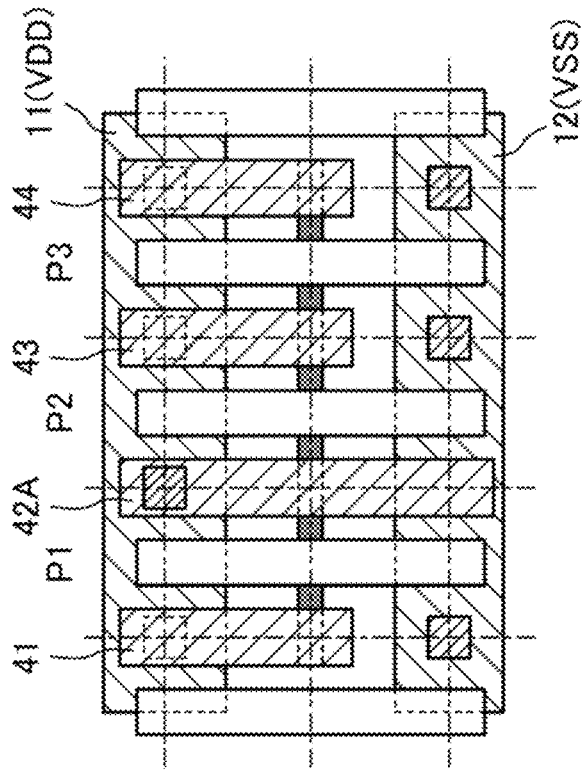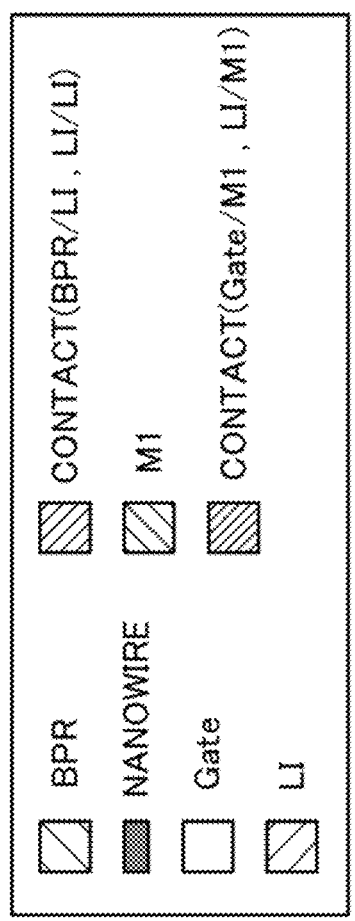
FIG.7A
FIG.7B

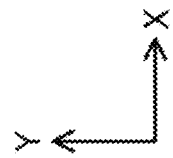
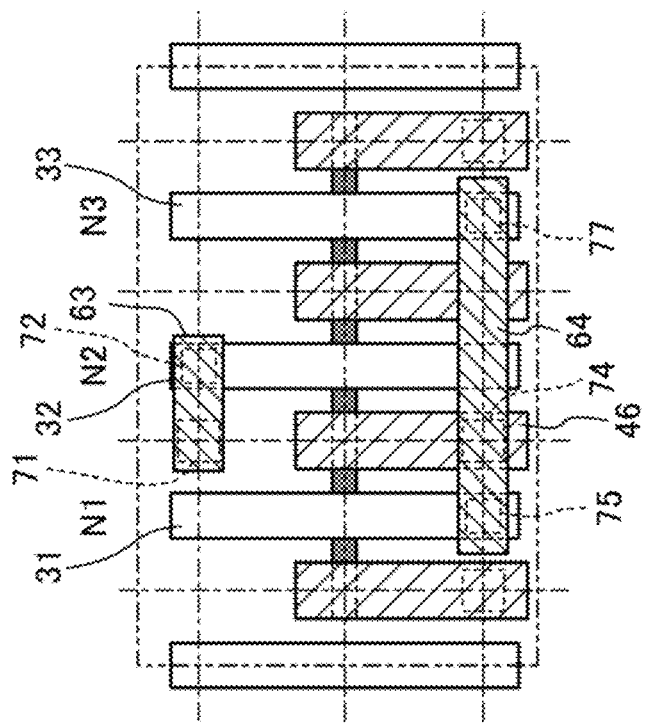
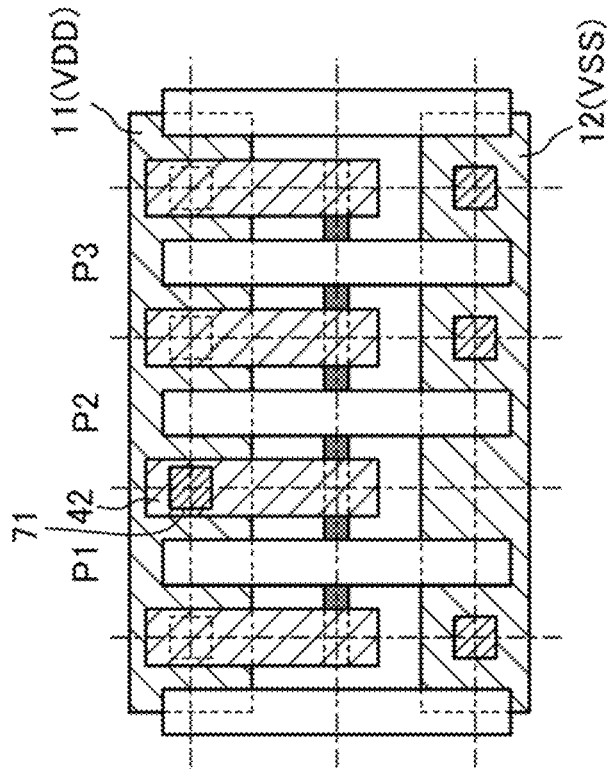
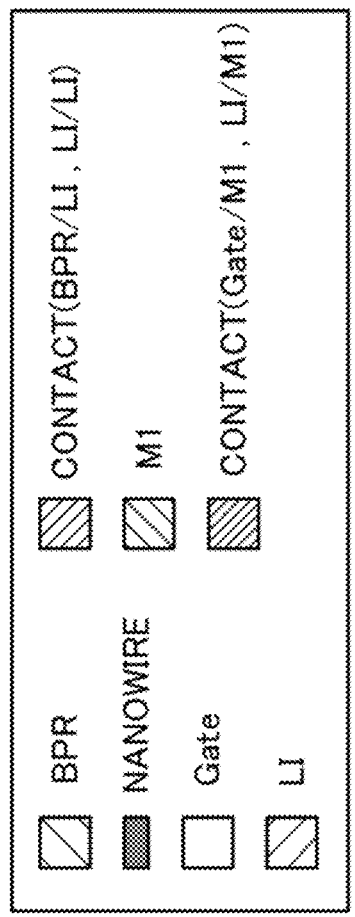

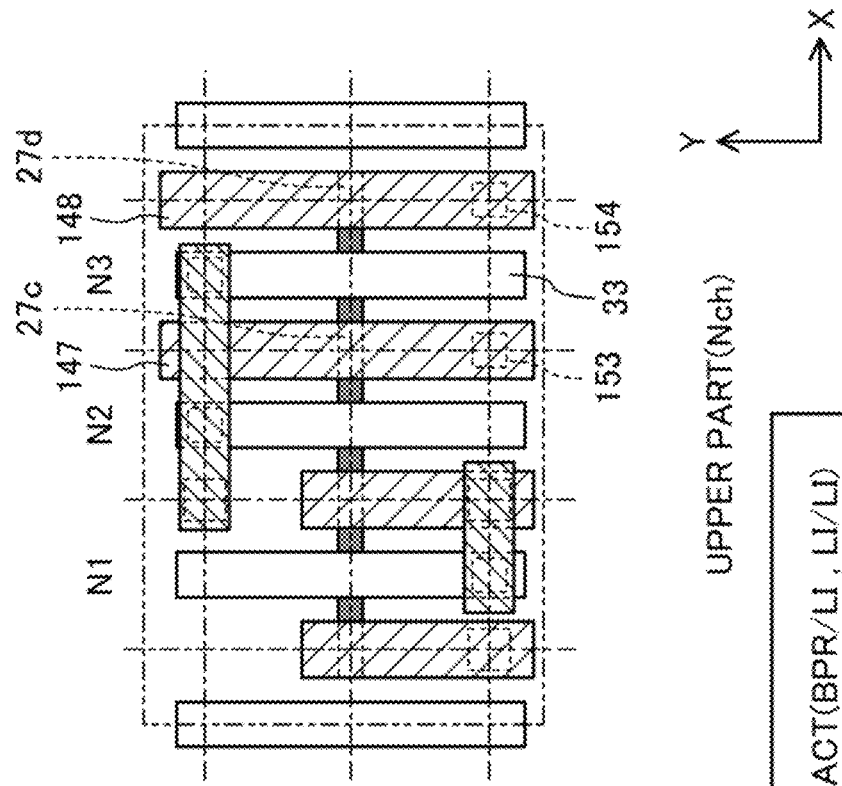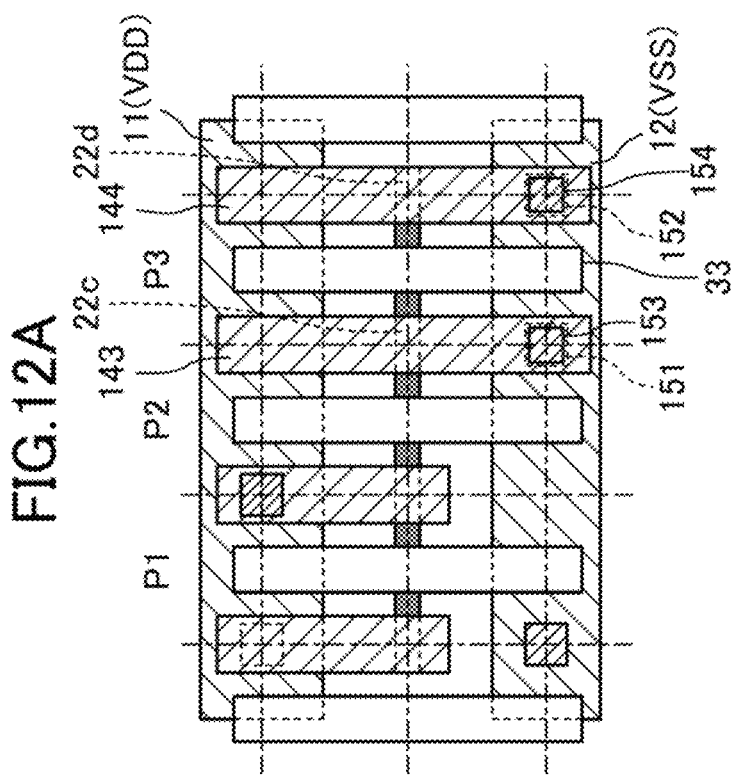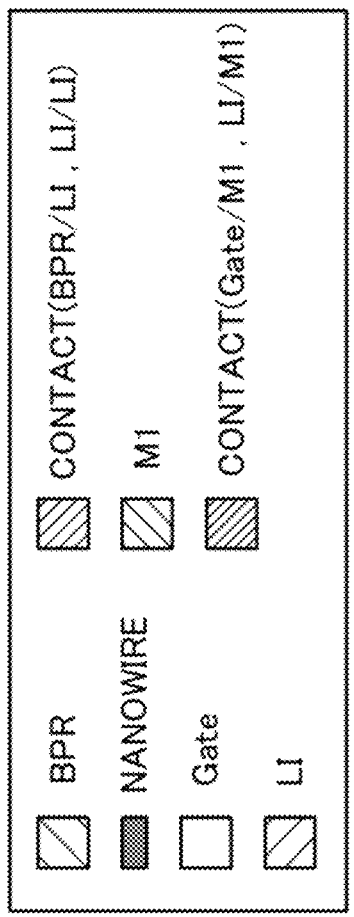

LOWER PART (Pch)

UPPER PART (Nch)

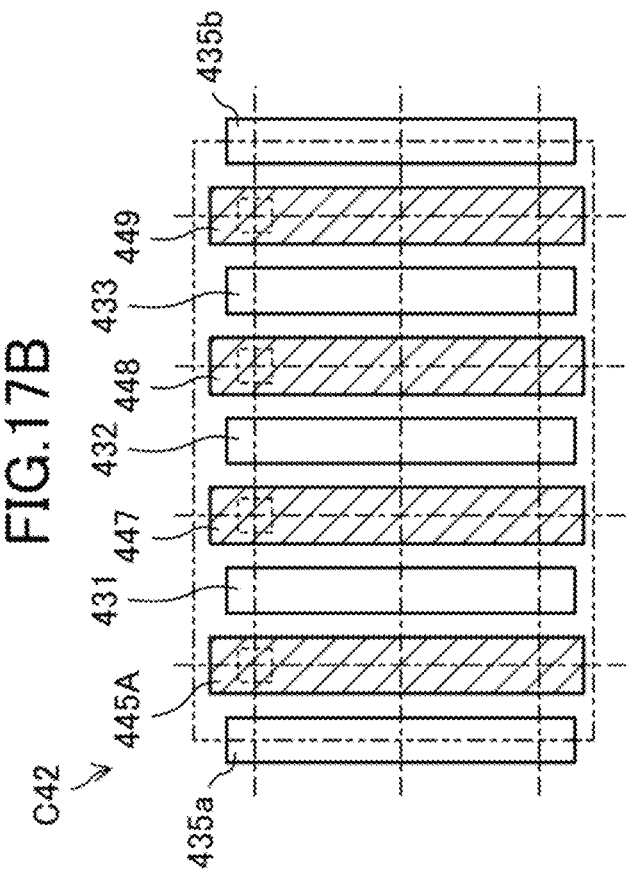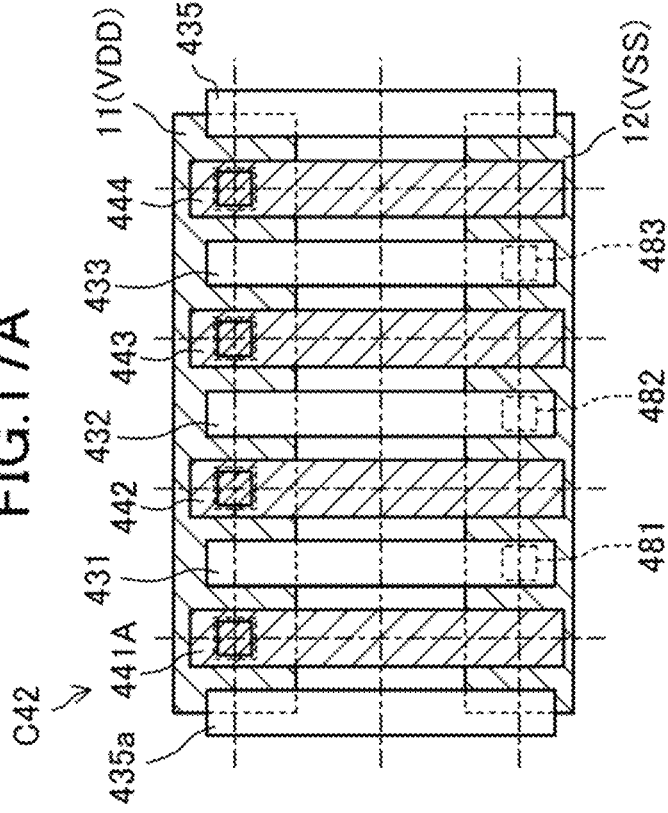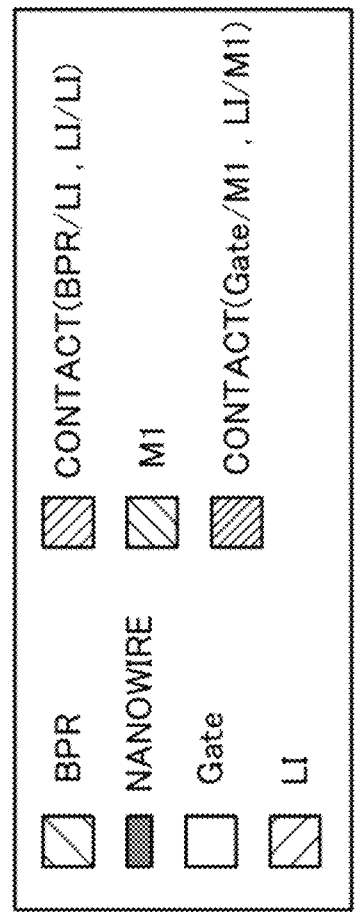

SEMICONDUCTOR INTEGRATED CIRCUIT DEVICE

CROSS-REFERENCE TO RELATED APPLICATIONS

This Application is a continuation of U.S. patent application Ser. No. 17/322,570, filed on May 17, 2021, now U.S. Pat. No. 11,908,799, which in turn is a continuation of International Application No. PCT/JP2019/044574, filed on Nov. 13, 2019, which claims priority to Japanese Patent Application No. 2018-220392, filed on Nov. 26, 2018. The entire disclosures of these applications are incorporated by reference herein.

BACKGROUND

The present disclosure relates to a semiconductor integrated circuit device provided with standard cells including three-dimensional transistors.

As a method for forming a semiconductor integrated circuit on a semiconductor substrate, a standard cell method is known. The standard cell method is a method in which basic units (e.g., inverters, latches, flipflops, and full adders) having specific logical functions are prepared in advance as standard cells, and a plurality of such standard cells are placed on a semiconductor substrate and connected through interconnects, thereby designing an LSI chip.

As for transistors as basic constituents of an LSI, improvement in integration degree, reduction in operating voltage, and improvement in operating speed have been achieved thanks to scaling down of the gate length. Recently, however, increase in off current due to excessive scaling and the resulting significant increase in power consumption have raised a problem. To solve this problem, three-dimensional transistors having a three-dimensional structure changed from the conventional planar structure have been vigorously studied.

Ryckaert J. et al., "The Complementary FET (CFET) for CMOS Scaling Beyond N3," 2018 Symposium on VLSI Technology Digest of Technical Papers and A. Mocuta et al., "Enabling CMOS Scaling Towards 3 nm and Beyond," 2018 Symposium on VLSI Technology Digest of Technical Papers disclose three-dimensional devices in which three-dimensional p-type FET and n-type FET are stacked vertically to a substrate, as novel devices, and standard cells using such devices.

As used herein, a three-dimensional device in which three-dimensional p-type FET and n-type FET are stacked vertically to a substrate is called a complementary FET (CFET) following the cited paper by Ryckaert J. et al. Also, the direction vertical to the substrate is herein called the depth direction.

The recent progress toward finer geometries and higher integration of semiconductor integrated circuit devices is significant, and along with this, reduction in operating voltage and speedup in operating frequency are being accelerated. However, noise increases with the speedup, and noise immunity decreases with the voltage reduction. The recent semiconductor integrated circuits therefore have a problem that malfunctions of circuits caused by noise easily occur. As a method for preventing a noise-caused malfunction of a circuit, a decoupling capacitance may be provided between power supplies of the circuit. A cell in which such a decoupling capacitance is formed is called a capacitance cell.

As of today, however, no examination has been made on a capacitance cell using a CFET.

An objective of the present disclosure is providing a layout structure of a capacitance cell using a CFET.

SUMMARY

In the first mode of the present disclosure, a semiconductor integrated circuit device including a standard cell as a capacitance cell is provided, the standard cell including: a first power supply line extending in a first direction and supplying a first power supply voltage; a second power supply line extending in the first direction and supplying a second power supply voltage different from the first power supply voltage; a capacitance part provided between the first power supply line and the second power supply line as viewed in plan; and a fixed-value output part provided between the first power supply line and the second power supply line as viewed in plan, for supplying the first power supply voltage or the second power supply voltage to the capacitance part, wherein the capacitance part has a first transistor that is a three-dimensional transistor of a first conductivity type, and a second transistor that is a three-dimensional transistor of a second conductivity type, formed above the first transistor in a depth direction, a source and drain of the first transistor are both connected to one of the first and second power supply lines, and a source and drain of the second transistor are both connected to one of the first and second power supply lines, the fixed-value output part has a third transistor that is a three-dimensional transistor of the first conductivity type, formed on a level with the first transistor in the depth direction, and a fourth transistor that is a three-dimensional transistor of the second conductivity type, formed on a level with the second transistor in the depth direction, a source of the third transistor is connected to the first power supply line and a drain thereof is connected to a gate of the fourth transistor, and a source of the fourth transistor is connected to the second power supply line and a drain thereof is connected to a gate of the third transistor, gates of the first and second transistors are both connected to the gate of the third transistor or the gate of the fourth transistor, and the source of the third transistor is used in common with the source or drain of the first transistor, or the source of the fourth transistor is used in common with the source or drain of the second transistor.

According to the above mode, in the standard cell as a capacitance cell, the capacitance part includes the first transistor that is a three-dimensional transistor of a first conductivity type and the second transistor that is a three-dimensional transistor of a second conductivity type formed above the first transistor in the depth direction. The source and drain of the first transistor are both connected to one of the first and second power supply lines, and the source and drain of the second transistor are both connected to one of the first and second power supply lines. The gates of the first and second transistors are both connected to the gate of the third or fourth transistor included in the fixed-value output part, and are supplied with the first power supply voltage or the second power supply voltage. With this, at least either one of the first and second transistors functions as a capacitance. Further, the source of the third transistor is used in common with the source or drain of the first transistor, or the source of the fourth transistor is used in common with the source or drain of the second transistor. This makes it possible to reduce the area of the standard cell as a capacitance cell.

In the second mode of the present disclosure, a semiconductor integrated circuit device including a standard cell as a capacitance cell is provided, the standard cell including: a first power supply line extending in a first direction and supplying a first power supply voltage; a second power supply line extending in the first direction and supplying a second power supply voltage different from the first power supply voltage; a capacitance part provided between the first power supply line and the second power supply line as viewed in plan; and a fixed-value output part provided between the first power supply line and the second power supply line as viewed in plan, for supplying the first power supply voltage or the second power supply voltage to the capacitance part, wherein the capacitance part has a first transistor that is a three-dimensional transistor, and a second transistor that is a three-dimensional transistor of the same conductivity type as the first transistor, formed above the first transistor in a depth direction, a source and drain of the first transistor and a source and drain of the second transistor are all connected to one of the first and second power supply lines, the fixed-value output part has a third transistor that is a three-dimensional transistor of the first conductivity type, formed on a level with the first transistor in the depth direction, and a fourth transistor that is a three-dimensional transistor of a second conductivity type different from the first conductivity type, formed on a level with the second transistor in the depth direction, a source of the third transistor is connected to the first power supply line and a drain thereof is connected to a gate of the fourth transistor, and a source of the fourth transistor is connected to the second power supply line and a drain thereof is connected to a gate of the third transistor, gates of the first and second transistors are both connected to the gate of the third transistor or the gate of the fourth transistor, and a dummy gate interconnect is placed between the first and second transistors and the third and fourth transistors.

According to the above mode, in the standard cell as a capacitance cell, the capacitance part includes the first transistor that is a three-dimensional transistor and the second transistor that is a three-dimensional transistor formed above the first transistor in the depth direction. The first and second transistors have the same conductivity type. The source and drain of the first transistor and the source and drain of the second transistor are all connected to one of the first and second power supply lines. The gates of the first and second transistors are both connected to the gate of the third or fourth transistor included in the fixed-value output part, and are supplied with the first power supply voltage or the second power supply voltage. With this, both the first and second transistors function as a capacitance. Further, a dummy gate interconnect is placed between the first and second transistors and the third and fourth transistors. This makes it possible to execute first-conductivity type doping and second-conductivity type doping without fail.

In the third mode of the present disclosure, a semiconductor integrated circuit device including a first standard cell and a second standard cell that is a capacitance cell is provided, the first standard cell including: a first power supply line extending in a first direction and supplying a first power supply voltage; a second power supply line extending in the first direction and supplying a second power supply voltage different from the first power supply voltage; a first transistor that is a three-dimensional transistor of a first conductivity type; a second transistor that is a three-dimensional transistor of a second conductivity type, formed above the first transistor in a depth direction; a first local interconnect connected with a source or drain of the first transistor, extending in a second direction perpendicular to the first direction as viewed in plan; a second local interconnect connected with a source or drain of the second transistor, extending in the second direction as viewed in plan; and a first gate interconnect that is to be a common gate of the first and second transistors, extending in the second direction as viewed in plan, the second standard cell including: a second gate interconnect formed on a level with the first gate interconnect in the depth direction; a third local interconnect formed on a level with the first local interconnect in the depth direction; and a fourth local interconnect formed on a level with the second local interconnect in the depth direction, wherein the second gate interconnect is electrically connected with one of the first and second power supply lines, and the third and fourth local interconnects are electrically connected with the other of the first and second power supply lines, and the third and fourth local interconnects overlap each other as viewed in plan and are adjacent to the second gate interconnect as viewed in plan.

According to the above mode, in the second standard cell as a capacitance cell, the second gate interconnect is supplied with either one of the first and second power supply voltages, and the third and fourth local interconnects are supplied with the other of the first and second power supply voltages. Also, the third and fourth local interconnects overlap each other as viewed in plan and are adjacent to the second gate interconnect as viewed in plan. Thus, inter-wire capacitances are formed between the second gate interconnect and the third and fourth local interconnects.

According to the present disclosure, a layout structure of a capacitance cell using a CFET can be provided.

BRIEF DESCRIPTION OF THE DRAWINGS

FIGS. 1A and 1B are plan views showing an example of the layout structure of a capacitance cell according to the first embodiment.

FIGS. 2A to 2C are cross-sectional views of the layout structure of FIGS. 1A and 1B taken horizontally as viewed in plan.

FIGS. 4A and 4B are plan views showing an example of the layout structure of a capacitance cell according to Alteration 1 of the first embodiment.

FIGS. 5A and 5B are plan views showing an example of the layout structure of a capacitance cell according to Alteration 2 of the first embodiment.

FIGS. 7A and 7B are plan views showing an example of the layout structure of a capacitance cell according to Alteration 3 of the first embodiment.

FIGS. 8A and 8B are plan views showing an example of the layout structure of a capacitance cell according to Alteration 4 of the first embodiment.

FIGS. 12A and 12B are plan views showing an example of the layout structure of a capacitance cell according to the second embodiment.

FIGS. 17A and 17B are plan views showing an example of the layout structure of a capacitance cell according to Alteration 1 of the fourth embodiment.

DETAILED DESCRIPTION

Embodiments of the present disclosure will be described hereinafter with reference to the accompanying drawings. In the following embodiments, a semiconductor integrated circuit device includes a plurality of standard cells (as used herein simply called cells as appropriate), and at least some of the plurality of standard cells include a CFET, that is, a three-dimensional device in which three-dimensional p-type FET and n-type FET are stacked vertically to a substrate.

Figure 18:
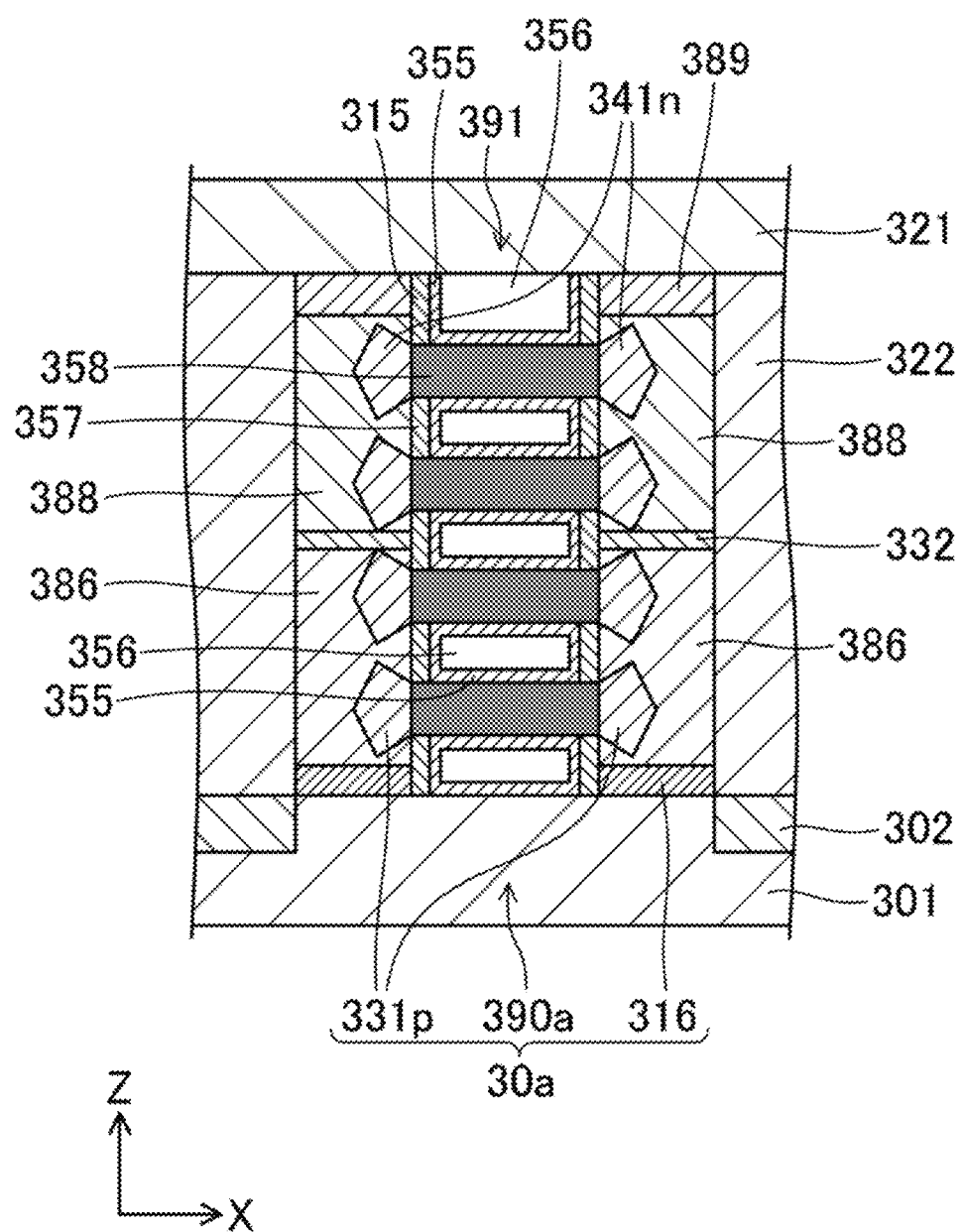
FIG. 18 is a cross-sectional view showing a structure of a semiconductor device provided with a CFET.
Figure 19:
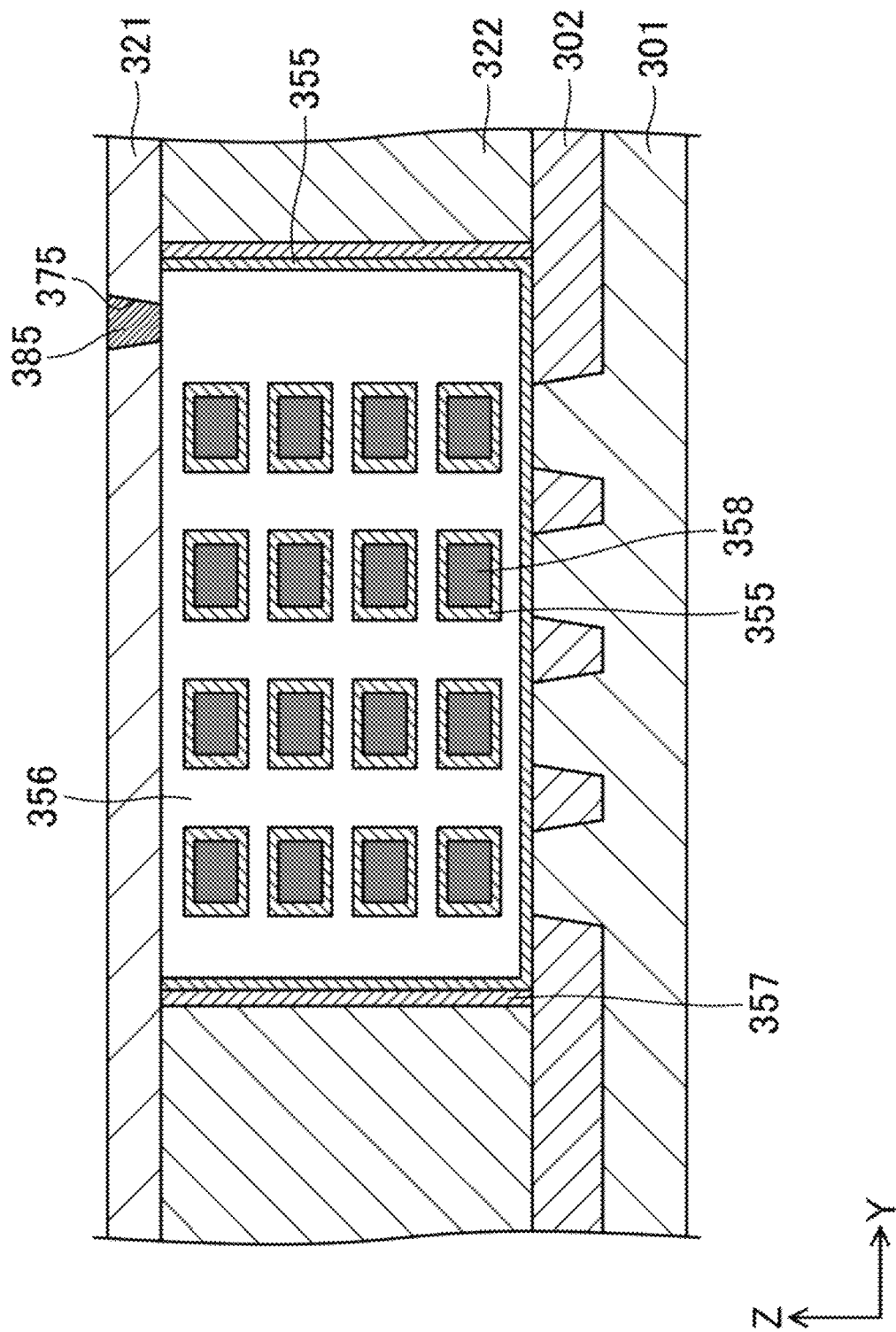
FIG. 19 is a cross-sectional view showing the structure of the semiconductor device provided with a CFET.
Figure 20:
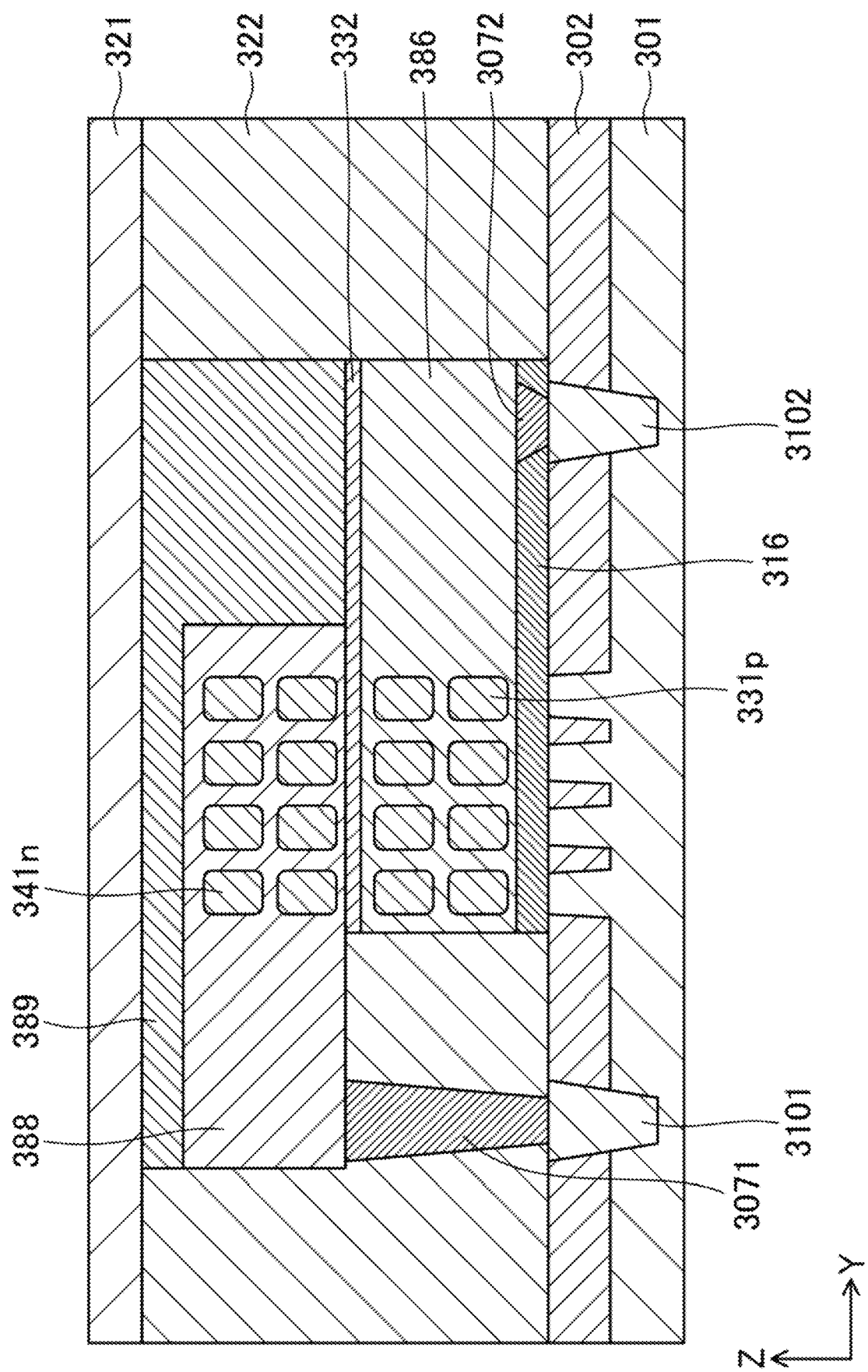
FIG. 20 is a cross-sectional view showing the structure of the semiconductor device provided with a CFET.
Figure 21:
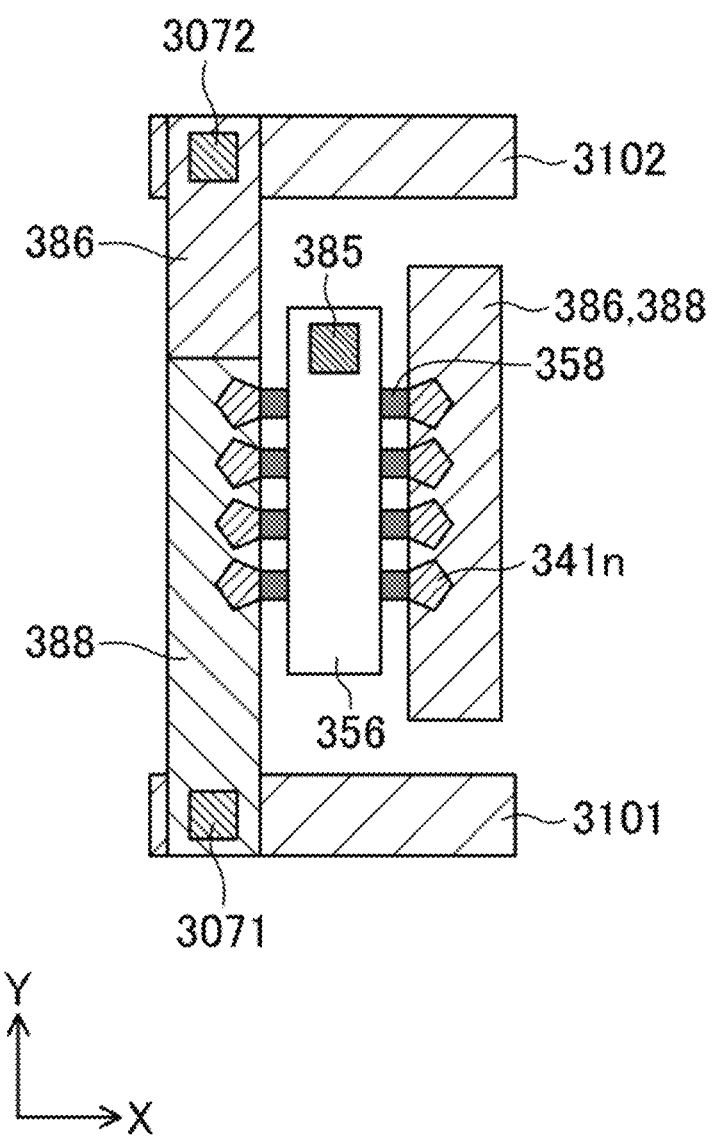
FIG. 21 is a plan view showing the structure of the semiconductor device provided with a CFET.

First, the basic structure of the CFET will be described. FIGS. 18 to 21 are views showing a structure of a semiconductor device provided with a CFET, where FIG. 18 is a cross-sectional view taken in an X direction, FIG. 19 is a cross-sectional view of a gate portion taken in a Y direction, FIG. 20 is a cross-sectional view of a source/drain portion taken in the Y direction, and FIG. 21 is a plan view. Note that the X direction refers to the direction in which nanowires extend, the Y direction refers to the direction in which a gate extends, and a Z direction refers to the direction vertical to the substrate plane. Note also that FIGS. 18 to 21 are schematic views in which the sizes and positions of the components are not necessarily consistent with one another.

In this semiconductor device, an element isolation region 302 is formed on a semiconductor substrate 301 such as a silicon (Si) substrate, and an element active region 30a is defined by the element isolation region 302. In the element active region 30a, an n-type FET is formed above a p-type FET.

In the element active region 30a, a stacked transistor structure 390a is formed on the semiconductor substrate 301. The stacked transistor structure 390a includes a gate structure 391 formed on the semiconductor substrate 301. The gate structure 391 includes a gate electrode 356, a plurality of nanowires 358, gate insulating films 355, and an insulating film 357. The gate electrode 356 extends in the Y direction and stands in the Z direction. The nanowires 358 extend through the gate electrode 356 in the X direction, and are arranged in the Y and Z directions. The gate insulating films 355 are formed between the gate electrode 356 and the nanowires 358. The gate electrode 356 and the gate insulating films 355 extend only up to positions receding from both ends of the nanowires 358 in the X direction, and the insulating film 357 is formed to fill the resultant recesses. An insulating film 316 is formed on the semiconductor substrate 301 to lie on both sides of the insulating film 357. The reference numerals 321 and 322 denote inter-layer insulating films.

As shown in FIG. 19, the gate electrode 356 is connected to an interconnect in an upper layer through a via 385 formed in an opening 375.

For the gate electrode 356, titanium, a titanium nitride, or polysilicon, for example, can be used. For the gate insulating films 355, a high dielectric constant material such as a hafnium oxide, an aluminum oxide, or an oxide of hafnium and aluminum, for example, can be used. For the nanowires 358, silicon, for example, can be used. For the insulating film 316 and the insulating film 357, a silicon oxide or a silicon nitride, for example, can be used.

In this semiconductor device, the number of nanowires 358 arranged in the Z direction is four. In the element active region 30a, p-type semiconductor layers 331p are formed at both ends of two nanowires 358 closer to the semiconductor substrate 301. Two local interconnects 386 in contact with the p-type semiconductor layers 331p are formed to sandwich the gate structure 391 in the X direction. Also, n-type semiconductor layers 341n are formed at both ends of two nanowires 358 apart from the semiconductor substrate 301. Two local interconnects 388 in contact with the n-type semiconductor layers 341n are formed to sandwich the gate structure 391 in the X direction. An insulating film 332 is formed between the local interconnects 386 and the local interconnects 388. An insulating film 389 is formed on the local interconnects 388. The p-type semiconductor layers 331p are p-type SiGe layers, and the n-type semiconductor layers 341n are n-type Si layers, for example. For the insulating film 332, a silicon oxide or a silicon nitride, for example, can be used.

Also, as shown in FIG. 20, the local interconnect 388 is connected with a buried interconnect 3101 through a via 3071, and the local interconnect 386 is connected with a buried interconnect 3102 through a via 3072.

As described above, the stacked transistor structure 390a has a p-type FET including the gate electrode 356, nanowires 358, gate insulating films 355, and the p-type semiconductor layers 331p. In the p-type FET, ones of the p-type semiconductor layers 331p on one side function as source regions, the other p-type semiconductor layers 331p on the other side function as drain regions, and the nanowires 358 function as channels. The stacked transistor structure 390a also has an n-type FET including the gate electrode 356, nanowires 358, gate insulating films 355, and the n-type semiconductor layers 341n. In the n-type FET, ones of the n-type semiconductor layers 341n on one side function as source regions, the other n-type semiconductor layers 341n on the other side function as drain regions, and the nanowires 358 function as channels.

Note that layers above the stacked transistor structure are used for wiring between transistors through vias and metal interconnects, which can be implemented by known wiring processes.

While the number of nanowires in each of the p-type FET and the n-type FET is four in the Y direction and two in the Z direction, i.e., eight in total, it is not limited to this. Also, the numbers of nanowires in the p-type FET and the n-type FET may be different from each other.

As used herein, a semiconductor layer portion formed on each end of a nanowire to constitute a terminal that is to be the source or drain of a transistor is called a "pad." In the illustrated example of the basic structure of the CFET, the p-type semiconductor layers 331p and the n-type semiconductor layers 341n correspond to pads.

Note that, in the plan views and cross-sectional views in the following embodiments, illustration of various insulating films may be omitted in some cases. Also, nanowires and pads at both ends of the nanowires may be illustrated in simplified linear shapes in some cases. Also, as used herein, an expression indicating that sizes, etc. are identical, such as the "same size," is to be understood as including a range of manufacturing variations.

Also, in the following embodiments, it is assumed that "VDD" and "VSS" are used to indicate power supply voltages or power supplies themselves.

First Embodiment

FIGS. 1A, 1B, and 2A to 2C are views showing an example of the layout structure of a capacitance cell according to the first embodiment, where FIGS. 1A and 1B are plan views, and FIGS. 2A to 2C are cross-sectional views taken in the horizontal direction as viewed in plan. Specifically, FIG. 1A shows a lower part, i.e., a portion including three-dimensional transistors formed closer to a substrate (p-type nanowire FETs in the illustrated example), and FIG. 1B shows an upper part, i.e., a portion including three-dimensional transistors formed away from the substrate (n-type nanowire FETs in the illustrated example). FIG. 2A shows a cross section taken along line X1-X1', FIG. 2B shows a cross section taken along line X2-X2', and FIG. 2C shows a cross section taken along line X3-X3'.

Figure 3:
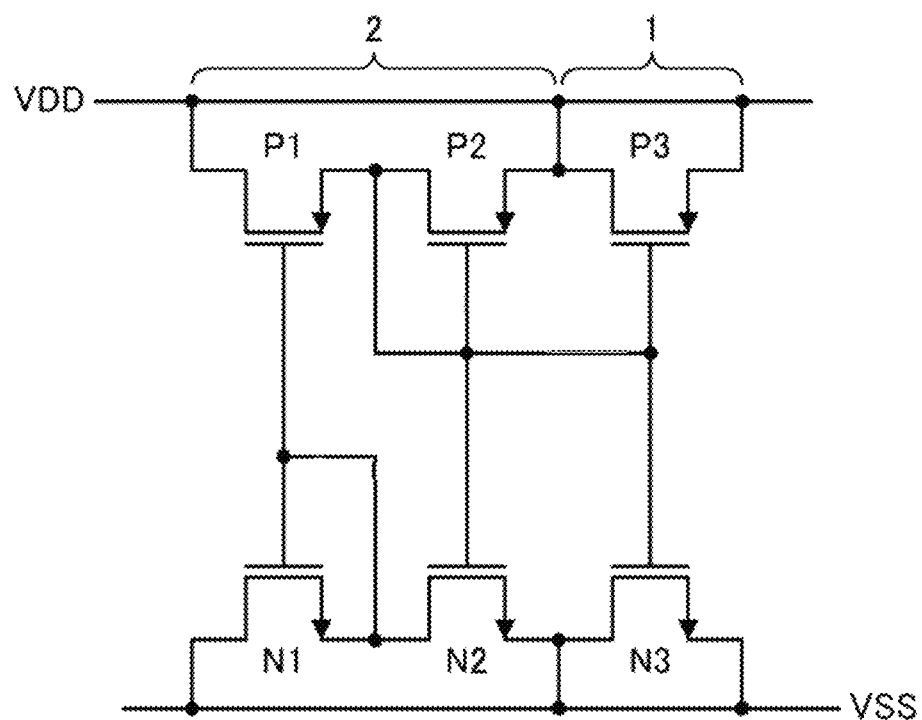
FIG. 3 is a circuit diagram of the capacitance cell of FIGS. 1A and 1B.

FIG. 3 is a circuit diagram of the capacitance cell shown in FIGS. 1A, 1B, and 2A to 2C. As shown in FIG. 3, the cell includes p-type transistors P1, P2, and P3 and n-type transistors N1, N2, and N3. A capacitance part 1 includes the p-type transistor N3 and the n-type transistor N3. A fixed-value output part 2 includes the p-type transistors P1 and P2 and the n-type transistors N1 and N2. The fixed-value output part 2 outputs a fixed value (VDD, VSS) to the gates of the transistors P3 and N3 in the capacitance part 1. In FIG. 3, the fixed-value output part 2 outputs VDD, i.e., a high fixed value.

The sources of the p-type transistors P1 and P2 are both connected to VDD, and the drains thereof are mutually connected. The sources of the n-type transistors N1 and N2 are both connected to VSS, and the drains thereof are mutually connected. The gates of the p-type transistor P1 and the n-type transistor N1 are mutually connected, and the gates of the p-type transistor P2 and the n-type transistor N2 are mutually connected. The drains of the p-type transistors P1 and P2 are connected to the gates of the p-type transistor P2 and the n-type transistor N2, and the drains of the n-type transistors N1 and N2 are connected to the gates of the p-type transistor P1 and the n-type transistor N1. The source and drain of the p-type transistor P3 are connected to VDD, and the source and drain of the n-type transistor N3 are connected to VSS. The gates of the p-type transistor P3 and the n-type transistor N3 are mutually connected, and the drains of the p-type transistors P1 and P2 are connected to the gates of the p-type transistor P3 and the n-type transistor N3.

The drain voltage of the p-type transistors P1 and P2 is VDD, i.e., a high fixed value. The n-type transistor N3, in which the source and the drain are fixed to VSS and VDD is supplied to the gate, functions as a capacitance. The p-type transistor P3, in which the source and the drain are fixed to VDD and VDD is supplied to the gate, is to be an off-state dummy transistor. Also, the p-type transistor P1 and the n-type transistor N2 are on, and the p-type transistor P2 and the n-type transistor N1 are off. The p-type transistor P1, in which the source and the drain are fixed to VDD and VSS is supplied to the gate, functions as a capacitance. The n-type transistor N2, in which the source and the drain are fixed to VSS and VDD is supplied to the gate, functions as a capacitance.

In the following description, in the plan views such as FIGS. 1A and 1B, the horizontal direction in the figure is called the X direction (corresponding to the first direction), and the vertical direction in the figure is called the Y direction (corresponding to the second direction). The direction vertical to the substrate plane is called the Z direction (corresponding to the depth direction). Also, the dashed lines running horizontally and vertically in the plan views such as FIGS. 1A and 1B and the dashed lines running vertically in the cross-sectional views such as FIGS. 2A to 2C represent grid lines used for placement of components at the time of designing. The grid lines are placed at equal spacing in the X direction and placed at equal spacing in the Y direction. The grid spacings in the X and Y directions may be the same, or different from each other. Also, the grid spacings may be different between layers. Further, the components are not necessarily required to lie on grid lines. It is however preferable to place the components on grid lines from the standpoint of reducing manufacturing variations.

As shown in FIG. 1A, power supply lines 11 and 12 extending in the X direction are provided on both ends of the capacitance cell in the Y direction. The power supply lines 11 and 12 are both buried power rails (BPR) formed in a buried wiring layer. The power supply line 11 supplies the power supply voltage VDD and the power supply line 12 supplies the power supply voltage VSS.

Nanowires 21a, 21b, and 21c extending in the X direction are formed in the lower part of the capacitance cell, and nanowires 26a, 26b, and 26c extending in the X direction are formed in the upper part of the capacitance cell. The nanowires 21a and 26a overlap each other as viewed in plan, the nanowires 21b and 26b overlap each other as viewed in plan, and the nanowires 21c and 26c overlap each other as viewed in plan. Gate interconnects 31, 32, and 33 extending in the Y direction as viewed in plan are formed in parallel over the lower and upper parts of the cell. The gate interconnect 31 is to be the gates of the p-type transistor P1 and the n-type transistor N1. The gate interconnect 32 is to be the gates of the p-type transistor P2 and the n-type transistor N2. The gate interconnect 33 is to be the gates of the p-type transistor P3 and the n-type transistor N3. Dummy gate interconnects 35a and 35b are formed on both ends of the capacitance cell in the X direction. Like the gate interconnect 31, the dummy gate interconnects 35a and 35b extend in the Y and Z directions.

Pads 22a, 22b, 22c, and 22d doped with a p-type semiconductor are respectively formed on the left of the nanowire 21a as viewed in the figure, between the nanowires 21a and 21b, between the nanowires 21b and 21c, and on the right of the nanowire 21c as viewed in the figure. Pads 27a, 27b, 27c, and 27d doped with an n-type semiconductor are respectively formed on the left of the nanowire 26a as viewed in the figure, between the nanowires 26a and 26b, between the nanowires 26b and 26c, and on the right of the nanowire 26c as viewed in the figure. The nanowires 21a, 21b, and 21c respectively constitute the channel portions of the p-type transistors P1, P2, and P3. The pad 22a constitutes a terminal that is to be the source of the p-type transistor P1, the pad 22b constitutes a terminal that is to be the common drain of the p-type transistors P1 and P2, the pad 22c constitutes a terminal that is to be the common source of the p-type transistors P2 and P3, and the pad 22d constitutes a terminal that is to be the drain of the p-type transistor P3. The nanowires 26a, 26b, and 26c respectively constitute the channel portions of the n-type transistors N1, N2, and N3. The pad 27a constitutes a terminal that is to be the source of the n-type transistor N1, the pad 27b constitutes a terminal that is to be the common drain of the n-type transistors N1 and N2, the pad 27c constitutes a terminal that is to be the common source of the n-type transistors N2 and N3, and the pad 27d constitutes a terminal that is to be the drain of the n-type transistor N3.

That is, the p-type transistor P1 is constituted by the nanowire 21a, the gate interconnect 31, and the pads 22a and 22b, the p-type transistor P2 is constituted by the nanowire 21b, the gate interconnect 32, and the pads 22b and 22c, and the p-type transistor P3 is constituted by the nanowire 21c, the gate interconnect 33, and the pads 22c and 22d. The n-type transistor N1 is constituted by the nanowire 26a, the gate interconnect 31, and the pads 27a and 27b, the n-type transistor N2 is constituted by the nanowire 26b, the gate interconnect 32, and the pads 27b and 27c, and the n-type transistor N3 is constituted by the nanowire 26c, the gate interconnect 33, and the pads 27c and 27d.

The p-type transistors P1, P2, and P3 are formed above the buried wiring layer in the Z direction, and the n-type transistors N1, N2, and N3 are formed above the p-type transistors P1, P2, and P3 in the Z direction.

In the lower part of the capacitance cell, local interconnects 41, 42, 43, and 44 are formed to extend in the Y direction. The local interconnects 41, 42, 43, and 44 are respectively connected with the pads 22a, 22b, 22c, and 22d. In the upper part of the capacitance cell, local interconnects 45, 46, 47, and 48 are formed to extend in the Y direction. The local interconnects 45, 46, 47, and 48 are respectively connected with the pads 27a, 27b, 27c, and 27d.

The local interconnect 41 extends up to a position overlapping the power supply line 11 as viewed in plan and is connected with the power supply line 11 through a contact 51. The contact 51 is formed at a position where the power supply line 11 and the local interconnect 41 overlap each other as viewed in plan. The local interconnect 43 extends up to a position overlapping the power supply line 11 as viewed in plan and is connected with the power supply line 11 through a contact 52. The contact 52 is formed at a position where the power supply line 11 and the local interconnect 43 overlap each other as viewed in plan. The local interconnect 44 extends up to a position overlapping the power supply line 11 as viewed in plan and is connected with the power supply line 11 through a contact 53. The contact 53 is formed at a position where the power supply line 11 and the local interconnect 44 overlap each other as viewed in plan.

The local interconnect 45 extends up to a position overlapping the power supply line 12 as viewed in plan and is connected with the power supply line 12 through a contact 54. The contact 54 is formed at a position where the power supply line 12 and the local interconnect 45 overlap each other as viewed in plan. The local interconnect 47 extends up to a position overlapping the power supply line 12 as viewed in plan and is connected with the power supply line 12 through a contact 55. The contact 55 is formed at a position where the power supply line 12 and the local interconnect 47 overlap each other as viewed in plan. The local interconnect 48 extends up to a position overlapping the power supply line 12 as viewed in plan and is connected with the power supply line 12 through a contact 56. The contact 56 is formed at a position where the power supply line 12 and the local interconnect 48 overlap each other as viewed in plan.

Interconnects 61 and 62 extending in the X direction are formed in an M1 wiring layer that is a metal wiring layer. The interconnect 61 is connected with the local interconnect 42 through a contact 71, and also connected with the gate interconnects 32 and 33 through contacts 72 and 73. The interconnect 62 is connected with the local interconnect 46 through a contact 74, and also connected with the gate interconnect 31 through a contact 75.

As described above, according to this embodiment, in the standard cell as a capacitance cell, the capacitance part 1 includes the transistor P3 as a p-type nanowire FET and the transistor N3 as an n-type nanowire FET formed above the transistor P3 in the depth direction. The source and drain of the transistor P3 are both connected to the power supply line 11, and the source and drain of the transistor N3 are both connected to the power supply line 12. The gates of the transistors P3 and N3 are both connected to the gate of the transistor N2 in the fixed-value output part 2, and are supplied with VDD. Thus, the transistor N3 functions as a capacitance.

Further, the terminal (pad 27c) that is to be the source of the transistor N2 is used in common with the source or drain of the transistor N3. Also, the terminal (pad 22c) that is to be the source of the transistor P2 is used in common with the source or drain of the transistor P3. This makes it possible to reduce the area of the standard cell as a capacitance cell.

Note that the p-type transistors P2 and P3 and the n-type transistor N1 that are to be off may be omitted from the capacitance cell according to this embodiment. From the standpoint of the layout structure, however, by forming the p-type transistors P2 and P3 and the n-type transistor N1, the ease of manufacturing improves, the yield improves, and variations in performance can be prevented.

Also, a power supply line fixed to VDD or VSS extending in the X direction may be formed in the M1 wiring layer along a grid line in the center in the Y direction. This will improve the capacitance value of the capacitance cell.

(Alteration 1)

FIGS. 4A and 4B are plan views showing an example of the layout structure of a capacitance cell according to Alteration 1 of this embodiment, where FIG. 4A shows a lower part and FIG. 4B shows an upper part. In the example of FIGS. 4A and 4B, the lower part includes n-type nanowire FETs (n-type transistors N1, N2, and N3), and the upper part includes p-type nanowire FETs (p-type transistors P1, P2, and P3). That is, the positional relationship between the p-type transistors and the n-type transistors in the Z direction is the opposite of that in the above-described embodiment. The circuit diagram is the same as FIG. 3.

An interconnect 67 connects the drains of the p-type transistors P1 and P2, the gates of the p-type transistor P2 and the n-type transistor N2, and the gates of the p-type transistor P3 and the n-type transistor N3. An interconnect 68 connects the gates of the p-type transistor P1 and the n-type transistor N1 and the drains of the n-type transistors N1 and N2.

(Alteration 2)

Figure 6:
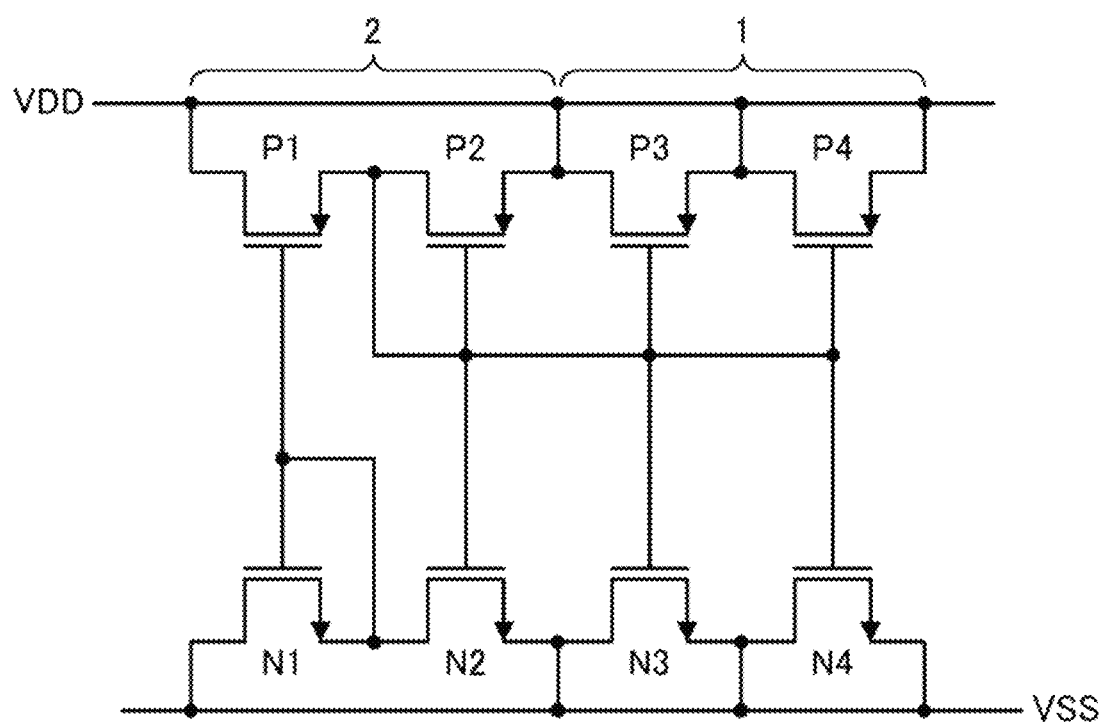
FIG. 6 is a circuit diagram of the capacitance cell of FIGS. 5A and 5B.

FIGS. 5A and 5B are plan views showing an example of the layout structure of a capacitance cell according to Alteration 2 of this embodiment, where FIG. 5A shows a lower part in which p-type nanowire FETs are formed, and FIG. 5B shows an upper part in which n-type nanowire FETs are formed. FIG. 6 is a circuit diagram of the capacitance cell shown in FIGS. 5A and 5B. As shown in FIG. 6, the capacitance part 1 of the capacitance cell has p-type transistors P3 and P4 and n-type transistors N3 and N4. That is, in the capacitance cell shown in FIGS. 5A and 5B, the p-type transistor P4 and the n-type transistor N4 are added to the capacitance cell shown in FIG. 3. The fixed-value output part 2 outputs a fixed value (VDD, VSS) to the gates of the transistors P3, P4, N3, and N4 in the capacitance part 1. In FIG. 6, the fixed-value output part 2 outputs VDD, i.e., a high fixed value.

The layout structure shown in FIGS. 5A and 5B is a structure in which a pattern making up the p-type transistor P4 and the n-type transistor N4 is added to the right of the layout structure shown in FIGS. 1A and 1B as viewed in the figure. The pattern making up the p-type transistor P4 and the n-type transistor N4 is similar to the pattern making up the p-type transistor P3 and the n-type transistor N3. Specifically, a nanowire 21d extending in the X direction is added in the lower part, and a nanowire 26d extending in the X direction is added in the upper part. The nanowires 21d and 26d overlap each other as viewed in plan. A pad 22e doped with a p-type semiconductor is formed at the right end of the nanowire 21d as viewed in the figure, and a pad 27e doped with an n-type semiconductor is formed at the right end of the nanowire 26d as viewed in the figure. A gate interconnect 34 extending in the Y direction as viewed in plan is additionally provided. The gate interconnect 34 is to be the gates of the p-type transistor P4 and the n-type transistor N4.

That is, the p-type transistor P4 is constituted by the nanowire 21d, the gate interconnect 34, and the pads 22d and 22e, and the n-type transistor N4 is constituted by the nanowire 26d, the gate interconnect 34, and the pads 27d and 27e.

A local interconnect 44a extending in the Y direction is connected to the pad 22e. The local interconnect 44a extends up to a position overlapping the power supply line 11 as viewed in plan, and is connected with the power supply line 11 through a contact 57. A local interconnect 48a extending in the Y direction is connected to the pad 27e. The local interconnect 48a extends up to a position overlapping the power supply line 12 as viewed in plan, and is connected with the power supply line 12 through a contact 58.

An interconnect 61A extends longer rightward as viewed in the figure by one grid spacing than the interconnect 61 in FIG. 1B. The extended portion is connected with the gate interconnect 34 through a contact 76.

For further addition of transistors in the capacitance part 1, a pattern similar to the pattern making up the p-type transistor P3 and the n-type transistor N3 may be further provided.

(Alteration 3)

FIGS. 7A and 7B are plan views showing an example of the layout structure of a capacitance cell according to Alteration 3 of this embodiment, where FIG. 7A shows a lower part in which p-type nanowire FETs are formed, and FIG. 7B shows an upper part in which n-type nanowire FETs are formed. The layout structure shown in FIGS. 7A and 7B is basically similar to the layout structure shown in FIGS. 1A and 1B, except that a local interconnect 42A in the lower part and local interconnects 45A, 47A, and 48A in the upper part are longer than the local interconnects 42, 45, 47, and 48 in FIGS. 1A and 1B.

That is, the local interconnect 42A extends long downward as viewed in the figure compared to the local interconnect 42 in FIG. 1A, having an overlap with the power supply line 12 as viewed in plan. The local interconnects 45A, 47A, and 48A extend long upward as viewed in the figure compared to the local interconnects 45, 47, and 48 in FIG. 1B, having an overlap with the power supply line 11 as viewed in plan. Also, in FIGS. 7A and 7B, the local interconnects 42A and 46 overlapping each other as viewed in plan are roughly aligned at their lower ends in the figure. The local interconnects 41 and 45A overlapping each other as viewed in plan are roughly aligned at their upper ends in the figure. The local interconnects 43 and 47A overlapping each other as viewed in plan are roughly aligned at their upper ends in the figure. The local interconnects 44 and 48A overlapping each other as viewed in plan are roughly aligned at their upper ends in the figure.

By extending the local interconnects as in this alteration, the capacitance values of the capacitances formed between the local interconnects in the upper part and the local interconnects in the lower part and the capacitances formed between the local interconnects and the gate interconnects are increased. It is therefore possible to increase the capacitance value of the capacitance cell.

(Alteration 4)

Figure 9:
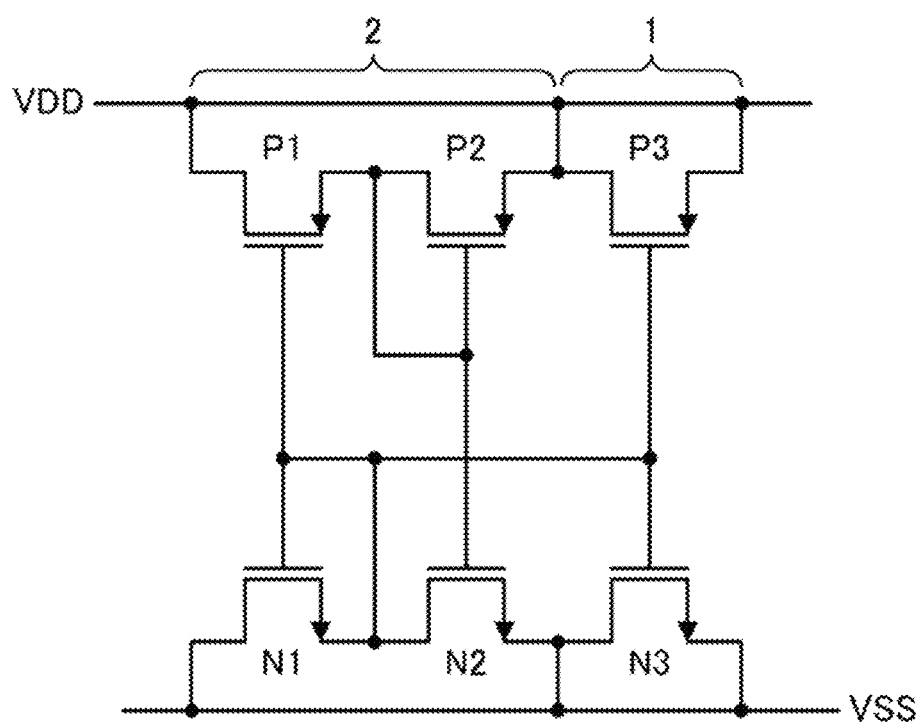
FIG. 9 is a circuit diagram of the capacitance cell of FIGS. 8A and 8B.

FIGS. 8A and 8B are plan views showing an example of the layout structure of a capacitance cell according to Alteration 4 of this embodiment, where FIG. 8A shows a lower part in which p-type nanowire FETs are formed, and FIG. 8B shows an upper part in which n-type nanowire FETs are formed. FIG. 9 is a circuit diagram of the capacitance cell shown in FIGS. 8A and 8B. As shown in FIG. 9, in the cell shown in FIGS. 8A and 8B, the fixed-value output part 2 outputs VSS, i.e., a low fixed value to the gates of the transistors P3 and N3 in the capacitance part 1. That is, the drains of the n-type transistors N1 and N2 are connected to the gates of the p-type transistor P3 and the n-type transistor N3.

The drain voltage of the n-type transistors N1 and N2 is VSS, i.e., a low fixed value. The p-type transistor P3, in which the source and the drain are fixed to VDD and VSS is supplied to the gate, functions as a capacitance. The n-type transistor N3, in which the source and the drain are fixed to VSS and VSS is supplied to the gate, is to be an off-state dummy transistor. Also, the p-type transistor P1, in which the source and the drain are fixed to VDD and VSS is supplied to the gate, functions as a capacitance. The n-type transistor N2, in which the source and the drain are fixed to VSS and VDD is supplied to the gate, functions as a capacitance. The p-type transistor P2 and the n-type transistor N1 are off.

The layout structure shown in FIGS. 8A and 8B is substantially similar to the layout structure shown in FIGS. 1A and 1B, except that interconnects 63 and 64 are formed in the M1 wiring layer in place of the interconnects 61 and 62. The interconnect 63 is connected with the local interconnect 42 through the contact 71, and also connected with the gate interconnect 32 through the contact 72. The interconnect 64 is connected with the local interconnect 46 through the contact 74, and also connected with the gate interconnects 31 and 33 through the contact 75 and a contact 77, respectively. That is, the interconnect 63 connects the drains of the p-type transistors P1 and P2 and the gates of the p-type transistor P2 and the n-type transistor N2. The interconnect 64 connects the gates of the p-type transistor P1 and the n-type transistor N1, the drains of the n-type transistors N1 and N2, and the gates of the p-type transistor P3 and the n-type transistor N3. The other structure is similar to FIGS. 1A and 1B.

(Alteration 5)

Figure 10:
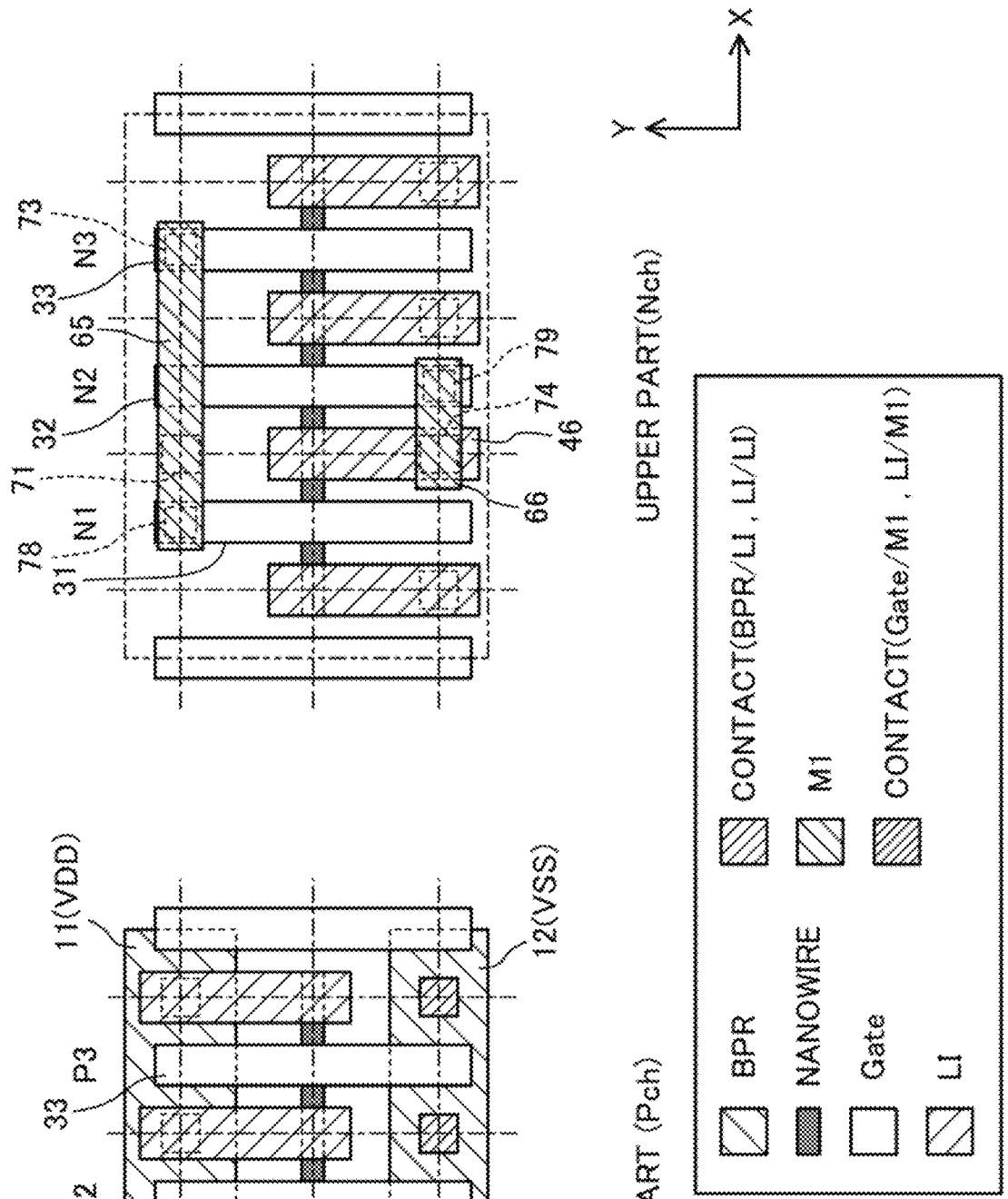
FIGS. 10A and 10B are plan views showing an example of the layout structure of a capacitance cell according to Alteration 5 of the first embodiment.
Figure 11:
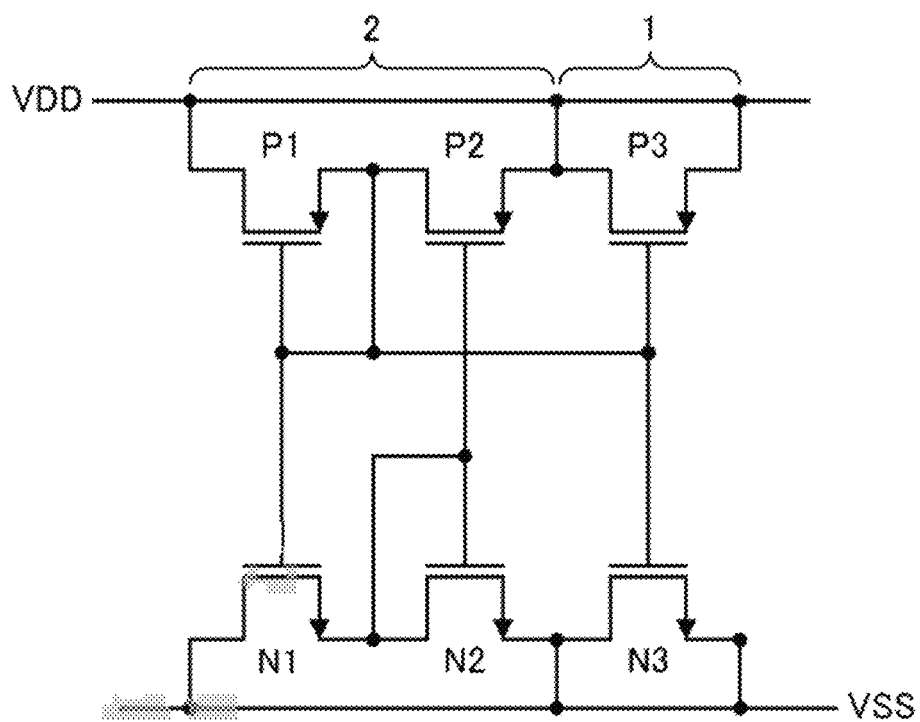
FIG. 11 is a circuit diagram of the capacitance cell of FIGS. 10A and 10B.

FIGS. 10A and 10B are plan views showing an example of the layout structure of a capacitance cell according to Alteration 5 of this embodiment, where FIG. 10A shows a lower part in which p-type nanowire FETs are formed, and FIG. 10B shows an upper part in which n-type nanowire FETs are formed. FIG. 11 is a circuit diagram of the capacitance cell shown in FIGS. 10A and 10B. As shown in FIG. 11, in this alteration, the placement of the transistors in the fixed-value output part 2 is horizontally inverted. That is, the drains of the p-type transistors P1 and P2 are connected to the gates of the p-type transistor P1 and the n-type transistor N1, and the drains of the n-type transistors N1 and N2 are connected to the gates of the p-type transistor P2 and the n-type transistor N2. In this alteration, therefore, the p-type transistor P2 and the n-type transistor N1 are on, and the p-type transistor P1 and the n-type transistor N2 are off.

The layout structure shown in FIGS. 10A and 10B is substantially similar to the layout structure shown in FIGS. 1A and 1B, except that interconnects 65 and 66 are formed in the M1 wiring layer in place of the interconnects 61 and 62. The interconnect 65 is connected with the local interconnect 42 through the contact 71, and also connected with the gate interconnects 31 and 33 through a contact 78 and the contact 73, respectively. The interconnect 66 is connected with the local interconnect 46 through the contact 74, and also connected with the gate interconnect 32 through a contact 79. That is, the interconnect 65 connects the drains of the p-type transistors P1 and P2, the gates of the p-type transistor P1 and the n-type transistor N1, and the gates of the p-type transistor P3 and the n-type transistor N3. The interconnect 66 connects the drains of the n-type transistors N1 and N2 and the gates of the p-type transistor P2 and the n-type transistor N2. The other structure is similar to FIGS. 1A and 1B.

In this alteration, the gates of the transistors P3 and N3 are both connected to the gate of the transistor N1 in the fixed-value output part 2, and are supplied with VDD. The transistor N3 therefore functions as a capacitance.

Note that, in this alteration, also, the p-type transistors P1 and P3 and the n-type transistor N2 that are to be off may be omitted. From the standpoint of the layout structure, however, by forming the p-type transistors P1 and P3 and the n-type transistor N1, the ease of manufacturing improves, the yield improves, and variations in performance can be prevented.

Second Embodiment

Figure 13:
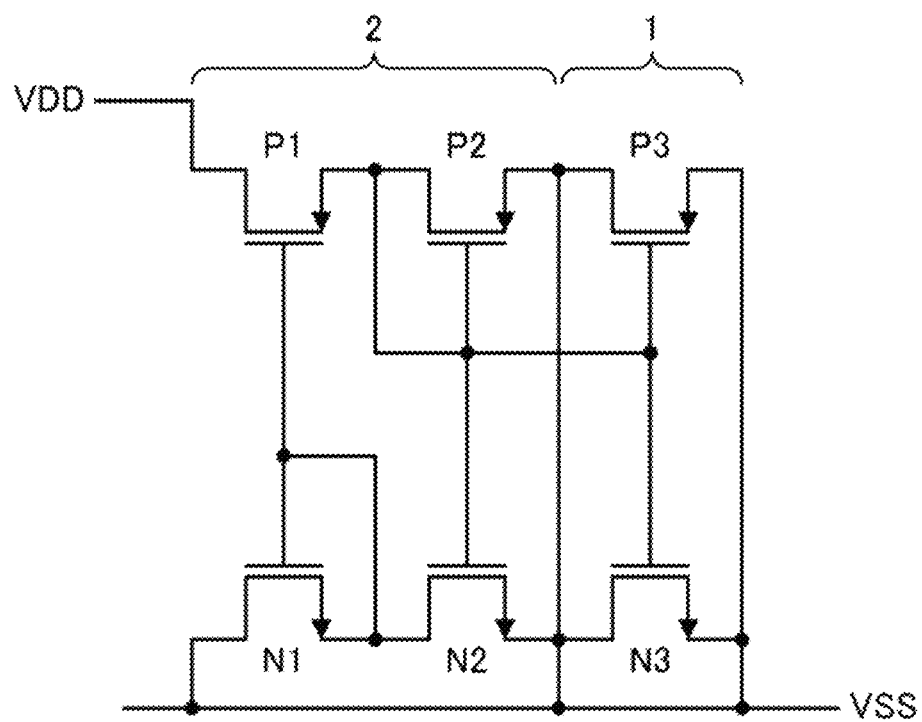
FIG. 13 is a circuit diagram of the capacitance cell of FIGS. 12A and 12B.

FIGS. 12A and 12B are plan views showing an example of the layout structure of a capacitance cell according to the second embodiment, where FIG. 12A shows a lower part in which p-type nanowire FETs are formed, and FIG. 12B shows an upper part in which n-type nanowire FETs are formed. FIG. 13 is a circuit diagram of the capacitance cell shown in FIGS. 12A and 12B. As shown in FIG. 13, in the capacitance cell of this embodiment shown in FIGS. 12A and 12B, the source and drain of the p-type transistor P3 in the capacitance part 1 are fixed to VSS, not VDD. Since VDD is supplied to the gate of the p-type transistor P3, the p-type transistor P3 is off.

As shown in FIG. 12A, in the lower part of the capacitance cell, local interconnects 143 and 144 extending in the Y direction are respectively connected to the pads 22c and 22d that are to be the source and drain of the p-type transistor P3. The local interconnect 143 extends up to a position overlapping the power supply line 12 as viewed in plan, and is connected with the power supply line 12 through a contact 151. The local interconnect 144 extends up to a position overlapping the power supply line 12 as viewed in plan, and is connected with the power supply line 12 through a contact 152. The local interconnects 143 and 144 also extend up to positions overlapping the power supply line 11 as viewed in plan.

As shown in FIG. 12B, in the upper part of the capacitance cell, local interconnects 147 and 148 extending in the Y direction are respectively connected to the pads 27c and 27d that are to be the source and drain of the n-type transistor N3. The local interconnect 147 extends up to a position overlapping the power supply line 12 as viewed in plan, and is connected with the power supply line 12 through a contact 153. The local interconnect 148 extends up to a position overlapping the power supply line 12 as viewed in plan, and is connected with the power supply line 12 through a contact 154. The local interconnects 147 and 148 also extend up to positions overlapping the power supply line 11 as viewed in plan. The other structure is similar to the layout structure described in the first embodiment.

In this embodiment, in the off-state p-type transistor P3, inter-wire capacitances are formed between the gate interconnect 33 and the local interconnects 143 and 144. This improves the capacitance value of the capacitance cell.

The alterations described in the first embodiment are also applicable to this embodiment.

Third Embodiment

Figure 14:
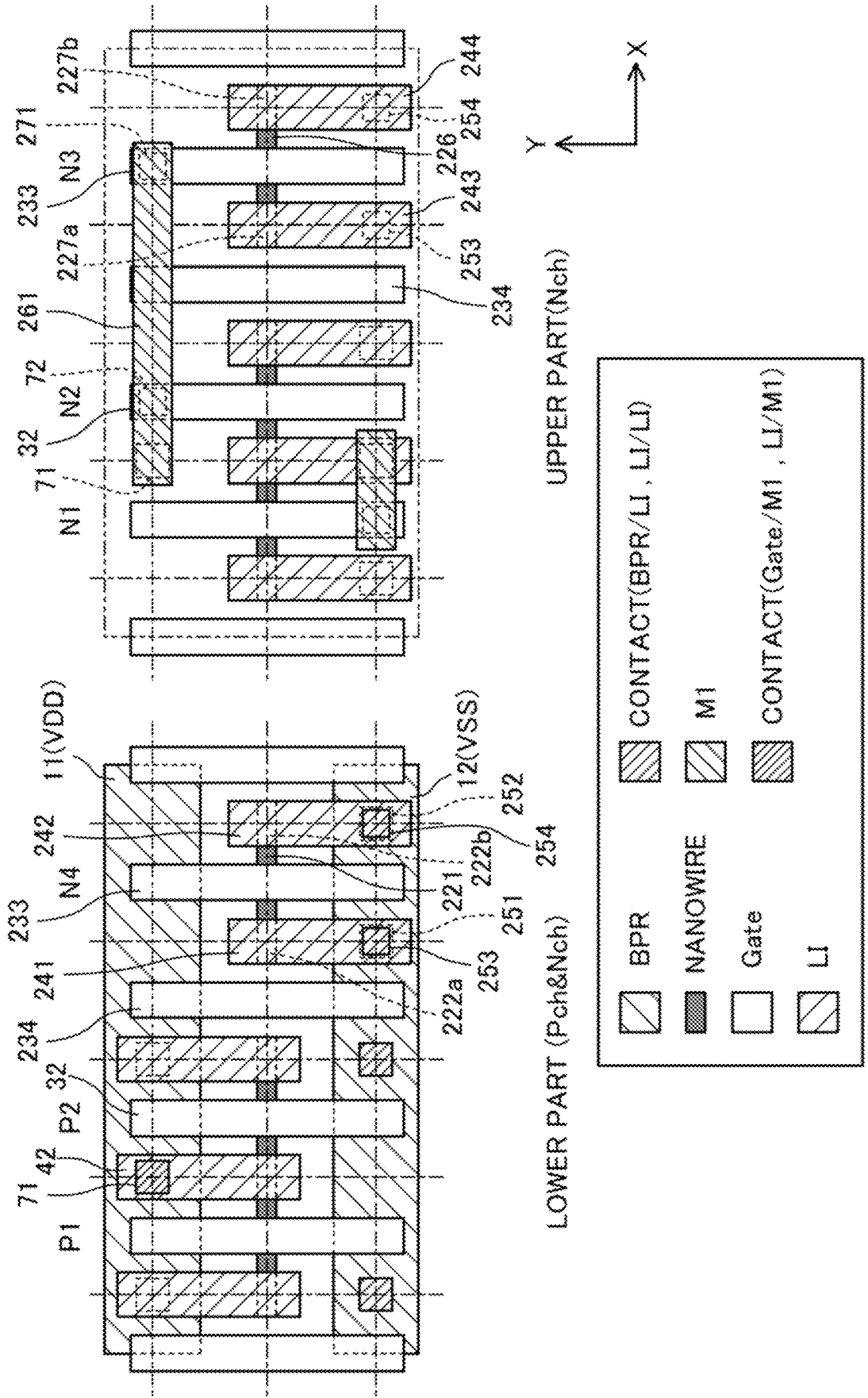
FIGS. 14A and 14B are plan views showing an example of the layout structure of a capacitance cell according to the third embodiment.
Figure 15:
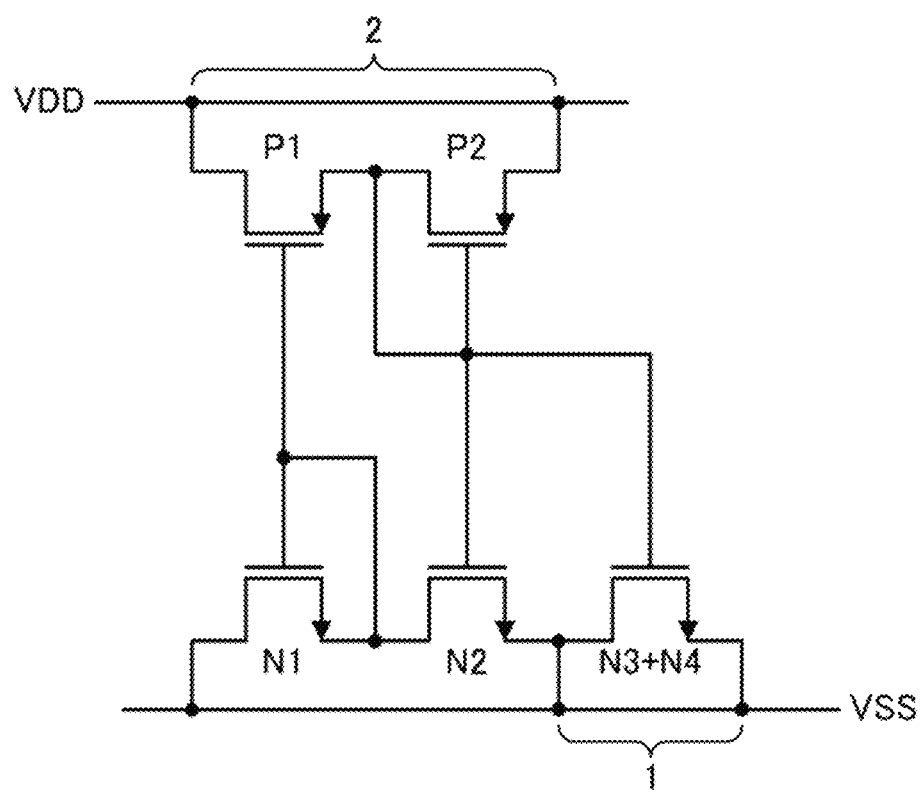
FIG. 15 is a circuit diagram of the capacitance cell of FIGS. 14A and 14B.

FIGS. 14A and 14B are plan views showing an example of the layout structure of a capacitance cell according to the third embodiment, where FIG. 14A shows a lower part and FIG. 14B shows an upper part. FIG. 15 is a circuit diagram of the capacitance cell shown in FIGS. 14A and 14B. As shown in FIG. 15, in the capacitance cell shown in FIGS. 14A and 14B, the capacitance part 1 has no p-type transistor and has n-type transistors N3 and N4. The source and drain of the n-type transistors N3 and N4 are fixed to VSS. As shown in FIG. 14A, p-type transistors P1 and P2 and the n-type transistor N4 are formed in the lower part of the capacitance cell, and as shown in FIG. 14B, n-type transistors N1, N2, and N3 are formed in the upper part of the capacitance cell.

A nanowire 221 extending in the X direction is formed in the lower part of the capacitance cell, and a nanowire 226 extending in the X direction is formed in the upper part of the capacitance cell. The nanowires 221 and 226 overlap each other as viewed in plan. A gate interconnect 233 extending in the Y direction as viewed in plan is formed over the lower and upper parts of the capacitance cell. The gate interconnect 233 is to be the gates of the n-type transistors N3 and N4. A dummy gate interconnect 234 is formed between the group of p-type transistors P1 and P2 and the n-type transistors N1 and N2 and the group of the n-type transistors N3 and N4. Like the gate interconnect 233, the dummy gate interconnect 234 extends in the Y and Z directions.

Pads 222a and 222b doped with an n-type semiconductor are formed at both ends of the nanowire 221. Pads 227a and 227b doped with an n-type semiconductor are formed at both ends of the nanowire 226. The nanowire 221 constitutes the channel portion of the n-type transistor N4, and the pads 222a and 222b constitute the terminals that are to be the source and drain of the n-type transistor N4. The nanowire 226 constitutes the channel portion of the n-type transistor N3, and the pads 227a and 227b constitute the terminals that are to be the source and drain of the n-type transistor N3.

That is, the nanowire 221, the gate interconnect 233, and the pads 222a and 222b constitute the n-type transistor N4.

The nanowire 226, the gate interconnect 233, and the pads 227a and 227b constitute the n-type transistor N3.

Local interconnects 241 and 242 extending in the Y direction are respectively connected to the pads 222a and 222b. The local interconnect 241 extends up to a position overlapping the power supply line 12 as viewed in plan and is connected with the power supply line 12 through a contact 251. The local interconnect 242 extends up to a position overlapping the power supply line 12 as viewed in plan and is connected with the power supply line 12 through a contact 252.

Local interconnects 243 and 244 extending in the Y direction are respectively connected to the pads 227a and 227b. The local interconnect 243 extends up to a position overlapping the power supply line 12 as viewed in plan, and is connected with the local interconnect 241, which is connected with the power supply line 12, through a contact 253. The local interconnect 244 extends up to a position overlapping the power supply line 12 as viewed in plan, and is connected with the local interconnect 242, which is connected with the power supply line 12, through a contact 254.

The gate interconnect 233 is connected with an interconnect 261 extending in the X direction through a contact 271. The interconnect 261 is connected with the local interconnect 42 through the contact 71 and also connected with the gate interconnect 32 through the contact 72.

According to this embodiment, in the standard cell as a capacitance cell, the capacitance part 1 includes the transistor N4 that is an n-type nanowire FET and the transistor N3 that is an n-type nanowire FET formed above the transistor N4 in the depth direction. The source and drain of the transistor N4 and the source and drain of the transistor N3 are all connected to the power supply line 12. The gates of the transistors N3 and N4 are both connected to the gate of the transistor P2 in the fixed-value output part 2, and are supplied with VDD. Thus, both the n-type transistors N3 and N4 function as capacitances. This improves the capacitance value of the capacitance cell.

The transistors in the lower part of the layout structure according to this embodiment can be fabricated in the following manner. That is, in formation of the transistors in the lower part, while the portion for the n-type transistor N4 is masked, the other portion is doped to have p-type conductivity. Thereafter, the portion for the n-type transistor N4 is doped to have n-type conductivity while the other portion is masked. By placing the dummy gate interconnect 234 between the n-type transistor N4 and the p-type transistor P2, the p-type doping and the n-type doping can be performed without fail.

Note that p-type transistors may be formed in place of the n-type transistors as the transistors constituting the capacitance part 1. In this case, VSS will be supplied to the gates of the p-type transistors constituting the capacitance part 1 as a fixed value from the fixed-value output part 2. For example, a p-type transistor constituting the fixed-value output part 2 and a p-type transistor constituting the capacitance part 1 may be formed in the lower part of the capacitance cell, and an n-type transistor constituting the fixed-value output part 2 and a p-type transistor constituting the capacitance part 1 may be formed in the upper part of the capacitance cell.

Also, a power supply line fixed to VDD or VSS extending in the X direction may be placed in the M1 wiring layer along a grid line in the center in the Y direction. This will improve the capacitance value of the capacitance cell.

The alterations described in the first embodiment are also applicable to this embodiment.

Fourth Embodiment

Figure 16A:
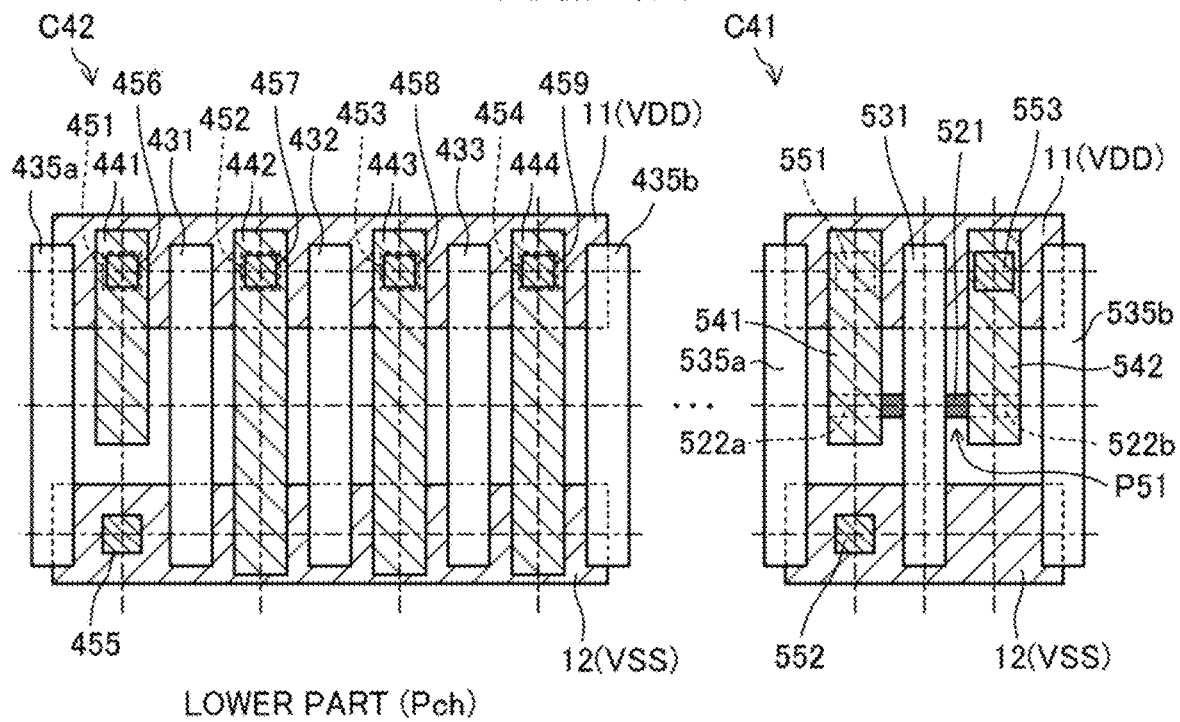
FIGS. 16A and 16B are plan views showing an example of the layout structure of a capacitance cell according to the fourth embodiment.
Figure 16B:
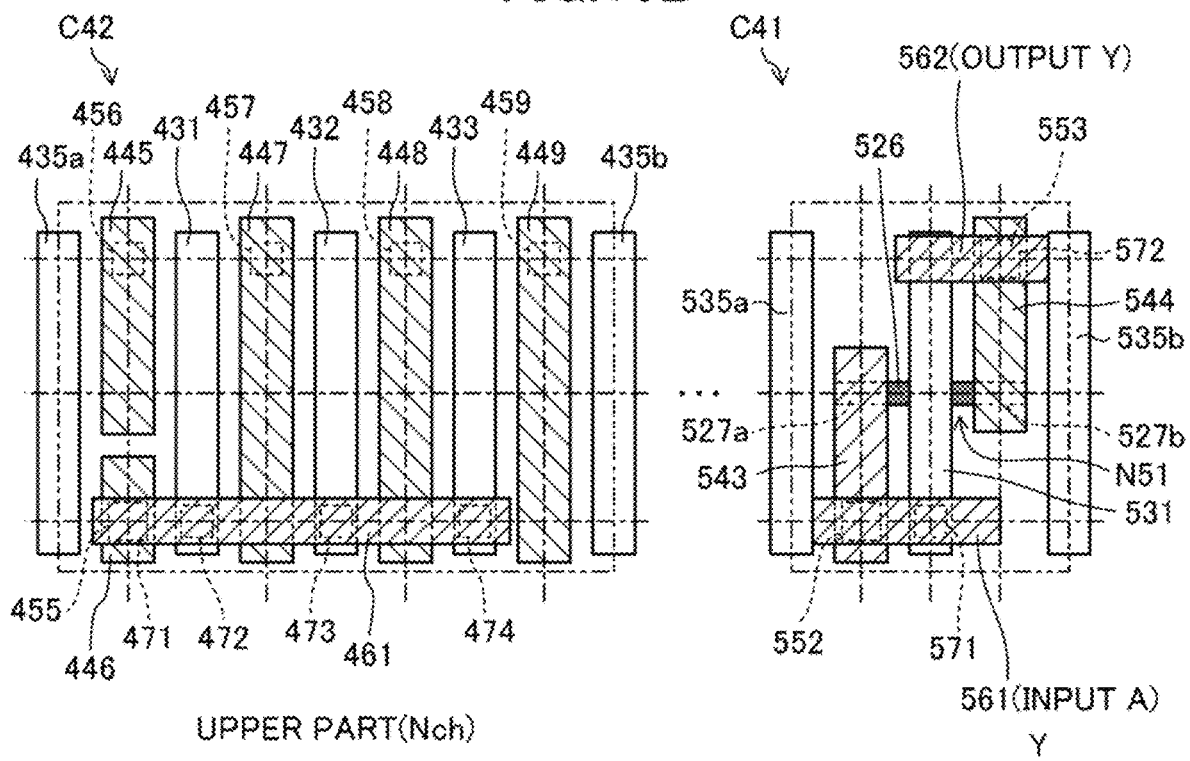

FIGS. 16A and 16B are plan views showing an example of the layout structure of a capacitance cell according to the fourth embodiment, where FIG. 16A shows a lower part and FIG. 16B shows an upper part. In FIGS. 16A and 16B, C41 denotes an inverter cell and C42 denotes a capacitance cell. The inverter cell C41 has a p-type transistor P51 and an n-type transistor N51. The capacitance cell C42 has no transistor, and its capacitance is constituted by only inter-wire capacitances.

In the inverter cell C41, a nanowire 521 extending in the X direction is formed in the lower part, and a nanowire 526 extending in the X direction is formed in the upper part. The nanowires 521 and 526 overlap each other as viewed in plan. Pads 522a and 522b doped with a p-type semiconductor are formed at both ends of the nanowire 521. Pads 527a and 527b doped with an n-type semiconductor are formed at both ends of the nanowire 526. The nanowire 521 constitutes the channel portion of the p-type transistor P51, and the pads 522a and 522b constitute the terminals that are to be the source or drain of the p-type transistor P51. The nanowire 526 constitutes the channel portion of the n-type transistor N51, and the pads 527a and 527b constitute the terminals that are to be the source or drain of the p-type transistor N51. The p-type transistor P51 is formed above the buried wiring layer in the Z direction, and the n-type transistor N51 is formed above the p-type transistor P51 in the Z direction.

A gate interconnect 531 extends in the Y direction in roughly the center of the inverter cell C41 in the X direction and also extends in the Z direction over the lower and upper parts. The gate interconnect 531 is to be the gates of the p-type transistor P51 and the n-type transistor N51. That is, the nanowire 521, the gate interconnect 531, and the pads 522a and 522b constitute the p-type transistor P51. The nanowire 526, the gate interconnect 531, and the pads 527a and 527b constitute the n-type transistor N51. Also, dummy gate interconnects 535a and 535b are formed on both ends of the inverter cell C41 in the X direction. Like the gate interconnect 531, the dummy gate interconnects 535a and 535b extend in the Y and Z directions.

In the lower part, local interconnects 541 and 542 are formed to extend in the Y direction. The local interconnect 541 is connected with the pad 522a, and the local interconnect 542 is connected with the pad 522b. In the upper part, local interconnects 543 and 544 are formed to extend in the Y direction. The local interconnect 543 is connected with the pad 527a, and the local interconnect 544 is connected with the pad 527b.

The local interconnect 541 extends up to a position overlapping the power supply line 11 as viewed in plan and is connected with the power supply line 11 through a contact 551. The local interconnect 543 extends up to a position overlapping the power supply line 12 as viewed in plan and is connected with the power supply line 12 through a contact 552. The local interconnects 542 and 544 are mutually connected through a contact 553.

An interconnect 561 corresponding to an input A of the inverter is connected with the gate interconnect 531 through a contact 571. An interconnect 562 corresponding to an output Y of the inverter is connected with the local interconnect 544 through a contact 572.

In the capacitance cell C42, gate interconnects 431, 432, and 433 are formed to extend in the Y direction as viewed in plan. The gate interconnects 431, 432, and 433 extend in the Z direction over the lower and upper parts of the capacitance cell C42. The gate interconnects 431, 432, and 433 are formed on a level with the gate interconnect 531 in the inverter cell C41 in the Z direction. Also, dummy gate interconnects 435a and 435b are formed on both ends of the capacitance cell C42 in the X direction. Like the gate interconnects 431, 432, and 433, the dummy gate interconnects 435a and 435b extend in the Y and Z directions.

In the lower part of the capacitance cell C42, local interconnects 441, 442, 443, and 444 are formed to extend in the Y direction. The local interconnects 441, 442, 443, and 444 are formed on a level with the local interconnect 541 and 542 in the inverter cell C41 in the Z direction. The local interconnects 441, 442, 443, and 444 are respectively formed between the dummy gate interconnect 435a and the gate interconnect 431, between the gate interconnects 431 and 432, between the gate interconnects 432 and 433, and between the gate interconnect 433 and the dummy gate interconnect 435b. The local interconnects 441, 442, 443, and 444 extend up to positions overlapping the power supply line 11 as viewed in plan and are connected with the power supply line 11 through contacts 451, 452, 453, and 454, respectively. Also, the local interconnects 442, 443, and 444 extend up to positions overlapping the power supply line 12 as viewed in plan.

In the upper part of the capacitance cell C42, local interconnects 445, 446, 447, 448, and 449 are formed to extend in the Y direction. The local interconnects 445, 446, 447, 448, and 449 are formed on a level with the local interconnect 543 and 544 in the inverter cell C41 in the Z direction. The local interconnects 445 and 446 are arranged in the Y direction between the dummy gate interconnect 435a and the gate interconnect 431. The local interconnects 447, 448, and 449 are respectively formed between the gate interconnects 431 and 432, between the gate interconnects 432 and 433, and between the gate interconnect 433 and the dummy gate interconnect 435b. The local interconnects 445, 447, 448, and 449 extend up to positions overlapping the power supply line 11 as viewed in plan, and are connected with the local interconnects 441, 442, 443, and 444, which are connected with the power supply line 11, through contacts 456, 457, 458, and 459, respectively. Also, the local interconnects 447, 448, and 449 extend up to positions overlapping the power supply line 12 as viewed in plan. The local interconnect 446 extends up to a position overlapping the power supply line 12 and is connected with the power supply line 12 through a contact 455.

The local interconnects 441 and 445 overlap each other as viewed in plan, the local interconnects 442 and 447 overlap each other as viewed in plan, the local interconnects 443 and 448 overlap each other as viewed in plan, and the local interconnects 444 and 449 overlap each other as viewed in plan. The gate interconnect 431 is adjacent to the local interconnects 441, 442, 445, and 447, the gate interconnect 432 is adjacent to the local interconnects 442, 443, 447, and 448, and the gate interconnect 433 is adjacent to the local interconnects 443, 444, 448, and 449.

An interconnect 461 extending in the X direction is connected with the local interconnect 446 through a contact 471. The interconnect 461 is also connected with the gate interconnects 431, 432, and 433 through contacts 472, 473, and 474, respectively.

In this embodiment, in the capacitance cell C42, the gate interconnects 431, 432, and 433 are connected to VSS through the interconnect 461. The local interconnects 441, 442, 443, 444, 445, 447, 448, and 449 are connected to VDD. Thus, inter-wire capacitances are formed between the gate interconnects 431, 432, and 433 and the adjacent local interconnects 441, 442, 443, 444, 445, 447, 448, and 449.

(Alteration 1)

FIGS. 17A and 17B are plan views showing an example of the layout structure of a capacitance cell according to an alteration of this embodiment, where FIG. 17A shows a lower part and FIG. 17B shows an upper part. In the capacitance cell C42 shown in FIGS. 17A and 17B, in comparison with the layout structure of FIGS. 16A and 16B, the interconnect 461 for connecting the gate interconnects 431, 432, and 433 to the power supply VSS is omitted, and also the local interconnect 446 and the contacts 455, 471, 472, 473, 474 are omitted. Instead, the gate interconnects 431, 432, and 433 are connected to the power supply line 12 through contacts 481, 482, and 483, respectively, formed right under the gate interconnects. A local interconnect 441A extends up to a position overlapping the power supply line 12 as viewed in plan, and a local interconnect 445A extends up to a position overlapping the power supply line 12 as viewed in plan. Thus, the capacitance value of the capacitance cell C42 can be increased.

A contact for connecting a gate interconnect and a BPR can be formed in the following manner, for example. That is, an insulating film above the BPR is removed, the removed portion is filled with a conductive material, and a gate interconnect is formed over the portion. Otherwise, a gate may be integrally formed over the portion including the film-removed portion.

In the above embodiment, the local interconnects are connected to VDD and the gate interconnects are connected to VSS. In reverse, the local interconnects may be connected to VSS and the gate interconnects may be connected to VDD.

While the size of the capacitance cell C42 in the X direction is of four grid spacings in the above embodiment, it is not limited to this.

In the above embodiments, while each transistor includes one nanowire, some or all of the transistors may include a plurality of nanowires. In this case, a plurality of nanowires may be arranged in the Y direction as viewed in plan, or may be arranged in the Z direction. Otherwise, a plurality of nanowires may be arranged in both the Y and Z directions. Also, the numbers of nanowires included in each transistor may be different between the upper and lower parts of the cell.

In the above embodiments, while the cross-sectional shape of the nanowire is roughly square, it is not limited to this. For example, it may be circular or rectangular.

While the above embodiments have been described taking nanowire FETs as an example of the three-dimensional transistors, the three-dimensional transistors are not limited to this type. For example, fin transistors may be used as the transistors formed in the lower part of the cell.

According to the present disclosure, a layout structure of a capacitance cell using a CFET can be provided. The present disclosure is therefore useful for improvement of the performance of a semiconductor chip, for example.

What is claimed is:

1. A semiconductor integrated circuit device including a standard cell as a capacitance cell, the standard cell comprising:
   a first power supply line extending in a first direction and supplying a first power supply voltage,
   a second power supply line extending in the first direction and supplying a second power supply voltage different from the first power supply voltage, a first transistor that is a three-dimensional transistor of a first conductivity type, a second transistor that is a three-dimensional transistor of a second conductivity type, formed above the first transistor in a depth direction, a third transistor that is a three-dimensional transistor of the first conductivity type, formed on a level with the first transistor in the depth direction, and a fourth transistor that is a three-dimensional transistor of the second conductivity type, formed on a level with the second transistor in the depth direction, a source and a drain of the first transistor and a source of the third transistor are connected to the first power supply line, gates of the first, second, third and fourth transistors are mutually connected, the second power supply voltage is supplied to the gates of the first, second, third and fourth transistors, and the source of the third transistor is used in common with the source or drain of the first transistor, and the source of the fourth transistor is used in common with the source or drain of the second transistor.

2. The semiconductor integrated circuit device of claim 1, wherein a source and a drain of the second transistor and a source of the fourth transistor are connected to the second power supply line.

3. The semiconductor integrated circuit device of claim 1, wherein a source and a drain of the second transistor and a source of the fourth transistor are connected to the first power supply line.

4. The semiconductor integrated circuit device of claim 1, wherein the first conductivity type is p-type and the second conductivity type is n-type.

5. The semiconductor integrated circuit device of claim 1, wherein the first conductivity type is n-type and the second conductivity type is p-type.

6. The semiconductor integrated circuit device of claim 1, wherein a drain of the third transistor is connected to the first power supply line.

7. The semiconductor integrated circuit device of claim 1, the standard cell further comprising:

a fifth transistor that is a three-dimensional transistor of the first conductivity type, formed on a level with the first transistor in the depth direction, and a sixth transistor that is a three-dimensional transistor of the second conductivity type, formed on a level with the second transistor in the depth direction, a source and a drain of the fifth transistor are connected to the first power supply line, gates of the fifth and sixth transistors are mutually connected, and the second power supply voltage is supplied to the gates of the fifth and sixth transistors.

8. A semiconductor integrated circuit device including a standard cell as a capacitance cell, the standard cell comprising:

a first power supply line extending in a first direction and supplying a first power supply voltage, a second power supply line extending in the first direction and supplying a second power supply voltage different from the first power supply voltage, a first transistor that is a three-dimensional transistor of a first conductivity type, a second transistor that is a three-dimensional transistor of a second conductivity type, formed above the first transistor in a depth direction, a third transistor that is a three-dimensional transistor of the first conductivity type, formed on a level with the first transistor in the depth direction, and a fourth transistor that is a three-dimensional transistor of the second conductivity type, formed on a level with the second transistor in the depth direction, a source and a drain of the second transistor and a source of the fourth transistor are connected to the first power supply line, gates of the first, second, third and fourth transistors are mutually connected, the second power supply voltage is supplied to the gates of the first, second, third and fourth transistors, and the source of the third transistor is used in common with the source or drain of the first transistor, and the source of the fourth transistor is used in common with the source or drain of the second transistor.

9. The semiconductor integrated circuit device of claim 8, wherein a source and a drain of the first transistor and a source of the third transistor are connected to the second power supply line.

10. The semiconductor integrated circuit device of claim 8, wherein a source and a drain of the first transistor and a source of the third transistor are connected to the first power supply line.

11. The semiconductor integrated circuit device of claim 8, wherein the first conductivity type is p-type and the second conductivity type is n-type.

12. The semiconductor integrated circuit device of claim 8, wherein the first conductivity type is n-type and the second conductivity type is p-type.

13. The semiconductor integrated circuit device of claim 8, wherein a drain of the fourth transistor is connected to the first power supply line.

14. The semiconductor integrated circuit device of claim 8, the standard cell further comprising:

a fifth transistor that is a three-dimensional transistor of the first conductivity type, formed on a level with the first transistor in the depth direction, and a sixth transistor that is a three-dimensional transistor of the second conductivity type, formed on a level with the second transistor in the depth direction, a source and a drain of the sixth transistor are connected to the first power supply line, gates of the fifth and sixth transistors are mutually connected, and the second power supply voltage is supplied to the gates of the fifth and sixth transistors.

\* \* \* \* \*